United States Patent
Beyerl et al.

(10) Patent No.: US 11,114,927 B2
(45) Date of Patent: **\*Sep. 7, 2021**

(54) BRUSHLESS DIRECT CURRENT MOTOR FOR POWER TOOLS

(71) Applicant: MILWAUKEE ELECTRIC TOOL CORPORATION, Brookfield, WI (US)

(72) Inventors: Andrew T. Beyerl, Pewaukee, WI (US); Keith Boulanger, Kenosha, WI (US); Matthew R. Bailey, Racine, WI (US); Carl B. Westerby, Menomonee Falls, WI (US)

(73) Assignee: MILWAUKEE ELECTRIC TOOL CORPORATION, Brookfield, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/095,484

(22) Filed: Nov. 11, 2020

(65) Prior Publication Data
US 2021/0067018 A1 Mar. 4, 2021

Related U.S. Application Data

(63) Continuation of application No. 15/894,386, filed on Feb. 12, 2018, now Pat. No. 10,848,042.
(Continued)

(51) Int. Cl.
*H02K 23/02* (2006.01)
*H02K 3/12* (2006.01)
(Continued)

(52) U.S. Cl.
CPC .......... *H02K 23/023* (2013.01); *H02K 1/146* (2013.01); *H02K 3/12* (2013.01); *H02K 3/345* (2013.01);
(Continued)

(58) Field of Classification Search
CPC .......... H02K 1/146; H02K 3/12; H02K 3/345; H02K 7/145; H02K 9/00; H02K 11/215;
(Continued)

(56) References Cited

U.S. PATENT DOCUMENTS 4,926,075 A 5/1990 Fushiya et al.
4,952,830 A 8/1990 Shirakawa
(Continued)

FOREIGN PATENT DOCUMENTS

CN 2733729 10/2005
CN 201185382 1/2009
(Continued)

OTHER PUBLICATIONS

Sakata et al., English Machine Translation of JP 2005-287240 (Year: 2005).*
(Continued)

*Primary Examiner* — Tulsidas C Patel
*Assistant Examiner* — Rashad H Johnson
(74) *Attorney, Agent, or Firm* — Michael Best & Friedrich LLP

(57) ABSTRACT

A brushless electric motor includes a stator and a rotor. The stator includes a core defining a plurality of stator teeth, a first end cap proximate a first end of the core, a second end cap proximate a second end of the core, and a plurality of coils disposed on the respective stator teeth. The stator also includes a plurality of coil contact plates overmolded within one of the first end cap or the second end cap that short-circuit diagonally opposite coils on the stator.

23 Claims, 21 Drawing Sheets

Related U.S. Application Data

(60) Provisional application No. 62/458,367, filed on Feb. 13, 2017.

(51) Int. Cl.

| | | |
|---|---|---|
| *H02K 3/34* | (2006.01) | |
| *H02K 11/33* | (2016.01) | |
| *H02K 11/215* | (2016.01) | |
| *H02K 7/14* | (2006.01) | |
| *H02K 29/08* | (2006.01) | |
| *H05K 1/02* | (2006.01) | |
| *H02K 1/14* | (2006.01) | |
| *H02K 9/00* | (2006.01) | |

(52) U.S. Cl.
CPC ........... *H02K 7/145* (2013.01); *H02K 11/215* (2016.01); *H02K 11/33* (2016.01); *H02K 29/08* (2013.01); *H05K 1/02* (2013.01); *H02K 9/00* (2013.01); *H02K 2211/03* (2013.01)

(58) Field of Classification Search
CPC ...... H02K 11/33; H02K 23/023; H02K 29/08; H02K 2211/03; H05K 1/02
USPC ....................... 310/51, 71, 89, 128, 195, 197
See application file for complete search history.

(56) References Cited

U.S. PATENT DOCUMENTS

| | | | |
|---|---|---|---|
| 4,982,124 A | 1/1991 | Cummings et al. | |
| 4,982,125 A | 1/1991 | Shirakawa | |
| 5,932,942 A | 8/1999 | Patyk et al. | |
| 6,107,708 A | 8/2000 | Yamaguchi et al. | |
| 6,297,572 B1 | 10/2001 | Sunaga et al. | |
| 6,522,130 B1 | 2/2003 | Lutz | |
| 6,552,453 B2 | 4/2003 | Ohiwa et al. | |
| 6,577,030 B2 | 6/2003 | Tominaga et al. | |
| 6,617,719 B2 | 9/2003 | Sunaga et al. | |
| 6,693,422 B2 | 2/2004 | Lutz | |
| 6,713,981 B2 | 3/2004 | Nakajima | |
| 6,774,599 B2 | 8/2004 | Ishii | |
| 6,856,057 B2 | 2/2005 | Kobayashi et al. | |
| 6,894,410 B2 | 5/2005 | Kobayashi et al. | |
| 6,930,418 B2 | 8/2005 | Kobayashi et al. | |
| 6,956,315 B2 | 10/2005 | Yoon et al. | |
| 6,993,829 B2 | 2/2006 | Kobayashi et al. | |
| 7,095,193 B2 | 8/2006 | Kellogg et al. | |
| 7,219,417 B2 | 5/2007 | Kobayashi et al. | |
| 7,262,529 B2 | 8/2007 | Klappenbach et al. | |
| 7,411,326 B2 | 8/2008 | Achor et al. | |
| 7,652,402 B2 | 1/2010 | Kinoshita et al. | |
| 7,714,529 B2 | 5/2010 | Chen et al. | |
| 7,739,788 B1 | 6/2010 | Prochazka et al. | |
| 7,755,231 B2 | 7/2010 | Kataoka et al. | |
| 7,791,232 B2 | 9/2010 | Purohit et al. | |
| 7,827,673 B2 | 11/2010 | Kataoka et al. | |
| 7,893,579 B2 | 2/2011 | Rudel et al. | |
| 8,035,263 B2 | 10/2011 | Kienzler et al. | |
| 8,035,269 B2 | 10/2011 | Bottger et al. | |
| 8,141,231 B2 | 3/2012 | Wolfe, Jr. et al. | |
| 8,169,119 B2 | 5/2012 | Eppler et al. | |
| 8,188,624 B2 | 5/2012 | Noh et al. | |
| 8,188,632 B2 | 5/2012 | Miyajima | |
| 8,247,937 B2 | 8/2012 | Minato et al. | |
| 8,304,942 B2 | 11/2012 | Yamasaki et al. | |
| 8,310,119 B2 | 11/2012 | Uryu et al. | |
| 8,310,121 B2 | 11/2012 | Fujita et al. | |
| 8,415,845 B2 | 4/2013 | Miyachi et al. | |
| 8,436,500 B2 | 5/2013 | Minato | |
| 8,456,049 B2 | 6/2013 | Matsuda et al. | |
| 8,471,418 B2 | 6/2013 | Yamasaki | |
| 8,546,896 B2 | 10/2013 | Marchitto et al. | |
| 8,552,604 B2 | 10/2013 | Matsuda et al. | |
| 8,564,161 B1 | 10/2013 | Yamasaki | |
| 8,630,095 B2 | 1/2014 | Minato et al. | |
| 8,649,159 B2 | 2/2014 | Fujita et al. | |
| 8,659,193 B2 | 2/2014 | Yamasaki et al. | |
| 8,803,383 B2 | 8/2014 | Miyachi et al. | |
| 8,829,746 B2 | 9/2014 | Yamasaki | |
| 8,890,380 B2 | 11/2014 | Andrieux et al. | |
| 8,916,999 B2 | 12/2014 | Imai et al. | |
| 9,025,336 B2 | 5/2015 | Minato et al. | |
| 9,271,422 B2 | 2/2016 | Yamasaki | |
| 9,450,471 B2 | 9/2016 | Mergener et al. | |
| 9,799,929 B2 | 10/2017 | Kawase et al. | |
| 2002/0094907 A1 | 7/2002 | Elger | |
| 2005/0088049 A1 | 4/2005 | De Filippis et al. | |
| 2005/0248320 A1 | 11/2005 | Denning | |
| 2006/0108881 A1 | 5/2006 | Hauger et al. | |
| 2006/0279162 A1 | 12/2006 | Achor et al. | |
| 2007/0232094 A1 | 10/2007 | Hoshika | |
| 2009/0127964 A1* | 5/2009 | Yumoto ................. H02K 3/522 |
| | | | 310/195 |
| 2010/0186978 A1 | 7/2010 | Sekino et al. | |
| 2011/0163701 A1 | 7/2011 | Carrier et al. | |
| 2011/0188232 A1 | 8/2011 | Friedman et al. | |
| 2012/0307476 A1 | 12/2012 | Masuzawa et al. | |
| 2013/0033217 A1 | 2/2013 | Hirabayashi | |
| 2013/0057294 A1 | 3/2013 | Mizoguchi et al. | |
| 2013/0113313 A1* | 5/2013 | Ikura ...................... H02K 3/522 |
| | | | 310/71 |
| 2013/0207491 A1 | 8/2013 | Hatfield et al. | |
| 2013/0218597 A1 | 8/2013 | Lorsch et al. | |
| 2013/0270934 A1 | 10/2013 | Smith et al. | |
| 2014/0035445 A1 | 2/2014 | Uryu et al. | |
| 2014/0145564 A1 | 5/2014 | Taniguchi et al. | |
| 2014/0147718 A1 | 5/2014 | Furui et al. | |
| 2014/0209341 A1 | 7/2014 | Nishikawa et al. | |
| 2014/0361645 A1 | 12/2014 | Beyerl | |
| 2015/0069864 A1 | 3/2015 | Nagahama et al. | |
| 2015/0149467 A1 | 5/2015 | Sar et al. | |
| 2015/0229172 A1 | 8/2015 | Kashihara et al. | |
| 2015/0249375 A1 | 9/2015 | Andrieux | |
| 2016/0021765 A1 | 1/2016 | Yu et al. | |
| 2016/0036286 A1 | 2/2016 | Yamasaki | |
| 2016/0094110 A1 | 3/2016 | Drye et al. | |
| 2016/0094175 A1 | 3/2016 | Yamasaki | |
| 2016/0111984 A1 | 4/2016 | Koizumi et al. | |
| 2016/0134178 A1 | 5/2016 | Acinas Lope et al. | |
| 2016/0149463 A1 | 5/2016 | Smith et al. | |
| 2016/0149474 A1 | 5/2016 | Smith et al. | |
| 2016/0192535 A1 | 6/2016 | Yamanaka | |
| 2016/0218596 A1 | 7/2016 | Hayashi | |
| 2016/0218598 A1 | 7/2016 | Hayashi | |
| 2017/0106521 A1 | 4/2017 | Kelleher et al. | |
| 2017/0214292 A1 | 7/2017 | Nagahama | |
| 2017/0296020 A1 | 10/2017 | Chen et al. | |
| 2017/0310194 A1 | 10/2017 | Beyerl | |
| 2017/0373614 A1 | 12/2017 | Lewis et al. | |
| 2018/0029148 A1* | 2/2018 | Suzuki .................... B23D 51/02 |
| 2018/0152062 A1* | 5/2018 | Chang .................... H02K 7/145 |
| 2019/0044110 A1* | 2/2019 | Sheeks .................... H02K 5/20 |
| 2019/0190351 A1 | 6/2019 | Gregorich et al. | |

FOREIGN PATENT DOCUMENTS

| | | |
|---|---|---|
| CN | 202535244 | 11/2012 |
| CN | 103023262 | 4/2013 |
| CN | 103036385 | 4/2013 |
| CN | 102664506 | 10/2014 |
| CN | 203933327 | 11/2014 |
| CN | 105322686 | 2/2016 |
| CN | 205123457 | 3/2016 |
| DE | 4311267 | 10/1994 |
| DE | 4332249 | 3/1995 |
| DE | 29512597 | 10/1995 |
| EP | 1215804 | 6/2002 |
| EP | 1659672 | 5/2006 |
| EP | 2889107 A1 | 7/2015 |
| JP | 2005287240 | 10/2005 |
| JP | 2005287240 A * | 10/2005 |
| JP | 2005341640 A | 12/2005 |

(56) References Cited

FOREIGN PATENT DOCUMENTS

| | | |
|---|---|---|
| JP | 2007135339 | 5/2007 |
| WO | 2006000131 | 1/2006 |
| WO | 2016021803 A1 | 2/2016 |

OTHER PUBLICATIONS

International Search Report and Written Opinion for Application No. PCT/US2018/043749 dated Nov. 21, 2018, 26 pages.
International Search Report and Written Opinion for Application No. PCT/US2018/017804 dated May 25, 2018, 12 pages.
Extended European Search Report for Application No. 18751952.5 dated Feb. 3, 2021 (12 pages).
Partial Search Report issued by the European Patent Office for Application No. 18751952.5 dated Nov. 2, 2020 (14 pages).

* cited by examiner

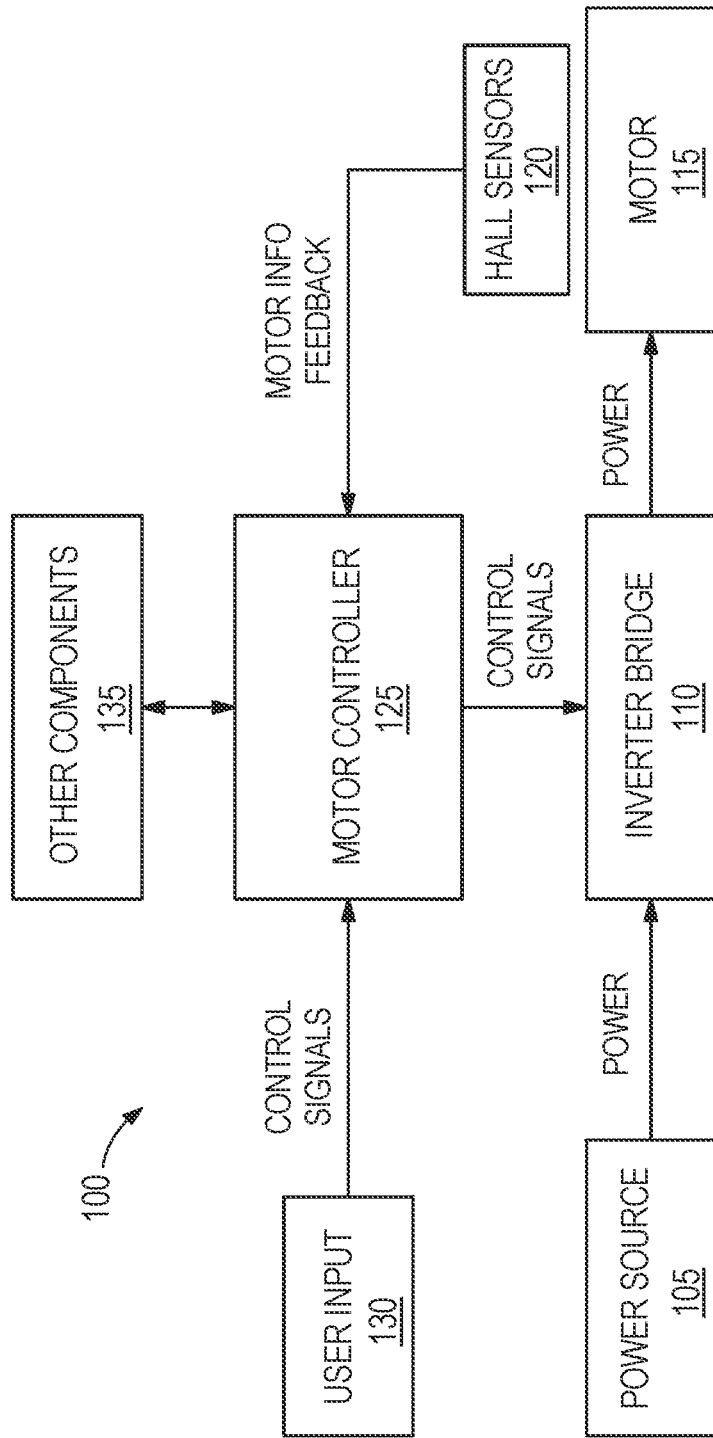

BRUSHLESS DIRECT CURRENT MOTOR FOR POWER TOOLS

CROSS-REFERENCE TO RELATED APPLICATIONS

This application is a continuation of U.S. patent application Ser. No. 15/894,386 filed on Feb. 12, 2018, now U.S. Pat. No. 10,848,042, which claims priority to U.S. Provisional Patent Application No. 62/458,367 filed on Feb. 13, 2017, the entire contents of which are incorporated herein by reference.

FIELD OF THE INVENTION

The present invention relates to brushless DC motors, and more particularly to brushless DC motors used in power tools.

SUMMARY OF THE INVENTION

The invention provides, in one aspect, a brushless electric motor including a rotor and a stator in which the rotor is received. The stator includes a core defining a plurality of stator teeth, an end cap coupled to the core, the end cap including a plurality of guiding tabs, a plurality of coils disposed on the respective stator teeth, and a plurality of coil contact plates overmolded within the end cap. Each of the coil contact plates includes a first terminal and a second terminal, and the first terminal and the second terminal each include a hook connected to one of the plurality of coils. The hook protrudes from the guiding tab.

The invention provides, in another aspect, a brushless electric motor including a rotor and a stator in which the rotor is received. The stator includes a core, an end cap coupled to the core, a first stator coil coupled to the core, a second stator coil coupled to the core, and a third stator coil coupled to the core. The second stator coil is positioned between the first stator coil and the third stator coil. The stator further includes a first coil contact plate and a second coil contact plate overmolded within the end cap. The first coil contact plate short-circuits the first stator coil with the third stator coil; and wherein the second coil contact plate is coupled to the second stator coil.

The invention provides, in another aspect, a brushless electric motor including a rotor and a stator in which the rotor is received. The stator includes a core defining a plurality of stator teeth, an end cap proximate an end of the core, a plurality of coils disposed on the respective stator teeth, and a plurality of coil contact plates overmolded within the end cap that short-circuit diagonally opposite coils on the stator.

Other aspects of the invention will become apparent by consideration of the detailed description and accompanying drawings.

BRIEF DESCRIPTION OF THE DRAWINGS

FIG. 1 is a block diagram of a power tool including a brushless DC motor in accordance with an embodiment of the invention.

Figure 2A:
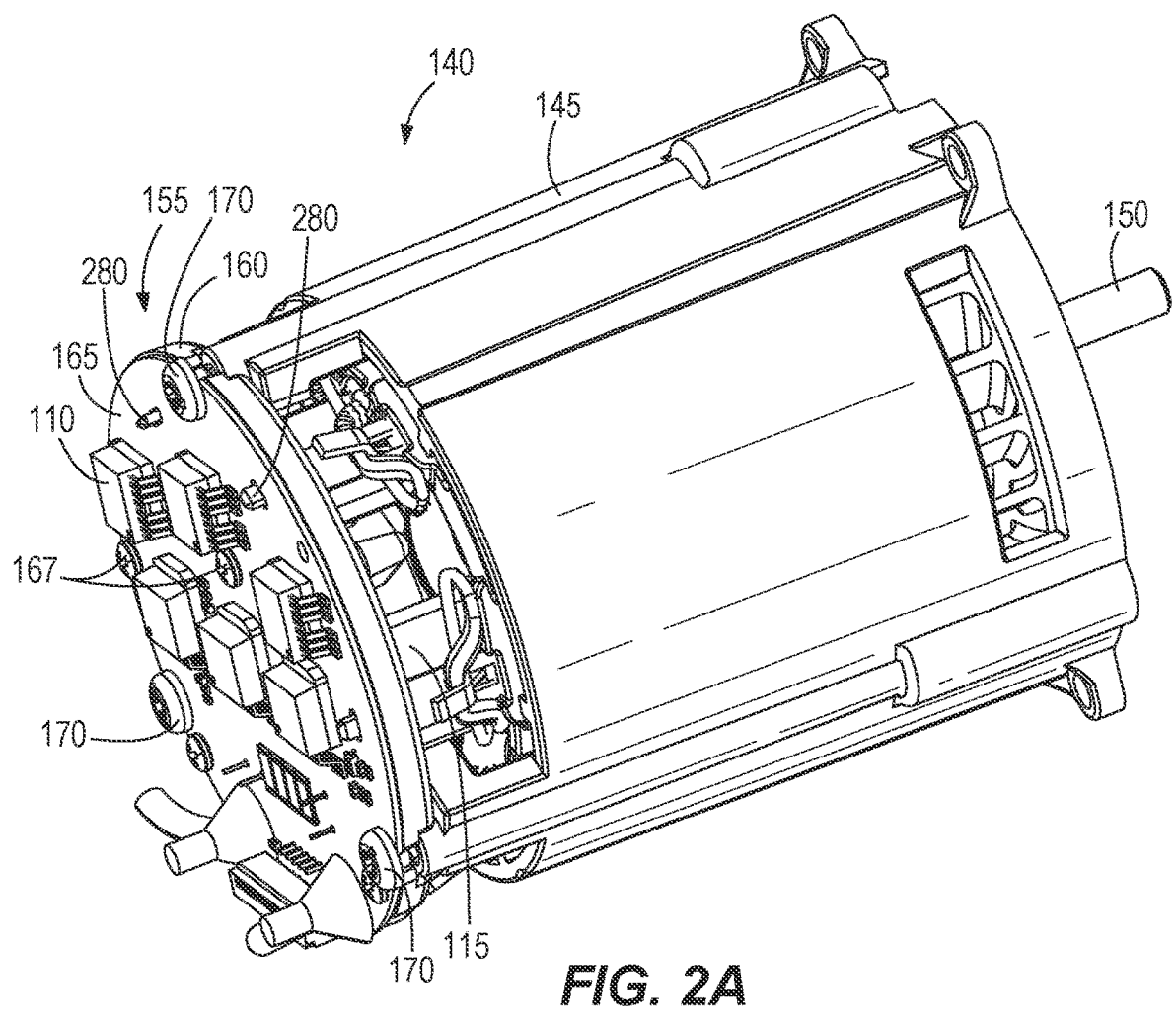
FIG. 2A is a perspective view of a motor assembly, including the brushless DC motor, in accordance with another embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

DETAILED DESCRIPTION

FIG. 1 illustrates a simplified block diagram of a power tool 100. The power tool 100 includes a power source 105, field effect transistors (FETs) 110, a brushless electric motor 115, Hall-effect sensors 120, a motor controller 125, user input 130, and other components 135 (such as current/voltage sensors, work lights (LEDs), etc.). The power source 105 provides DC power to the various components of the power tool 100 and may be a power tool battery pack that is rechargeable (e.g., a Lithium-ion battery pack). In some instances, the power source 105 may receive AC power (e.g., 120V/60 HZ) from a tool plug that is coupled to a standard wall outlet. The AC power may then be converted into DC power and provided to the components of the power tool 100. The power source 105 provides operating power to the motor 115 through the FETs 110 (e.g., an inverter bridge).

The Hall-effect sensors 120 output motor feedback information, such as an indication (e.g., a pulse) when the Hall-effect sensors detect a pole of a magnet attached to a rotating shaft 150 of the motor 115. Based on the motor feedback information from the Hall-effect sensors 120, the motor controller 125 may determine the rotational position, velocity, and/or acceleration of the shaft 150. The motor controller 125 also receives control signals from the user input 130. The user input 130 may include, for example, a trigger switch, a forward/reverse selector switch, a mode selector switch, etc. In response to the motor feedback information and user control signals, the motor controller 125 transmits control signals to the FETs 110 to drive the motor 115. By selectively activating the FETs 110, power from the power source 105 is selectively applied to opposed coils of the motor 115 to cause rotation of a shaft 150. Although not shown, the motor controller 125 and other components 135 of the power tool 100 may also be electrically connected to the power source 105 to receive operating power from the power source 105.

Figure 2B:
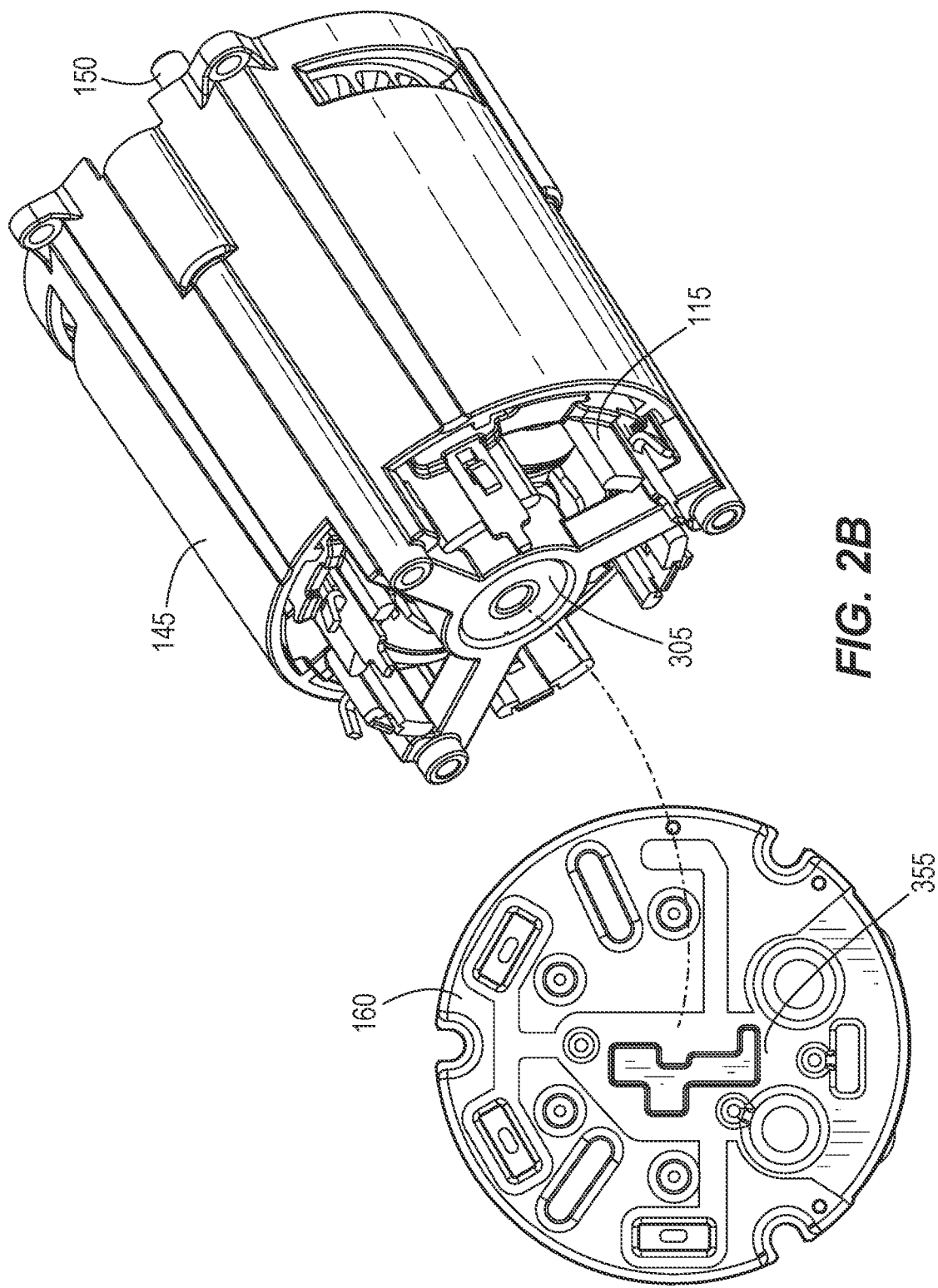
FIG. 2B is a rear perspective view of the motor assembly of FIG. 2, illustrating a PCB assembly exploded from the remainder of the motor assembly.
Figure 3:
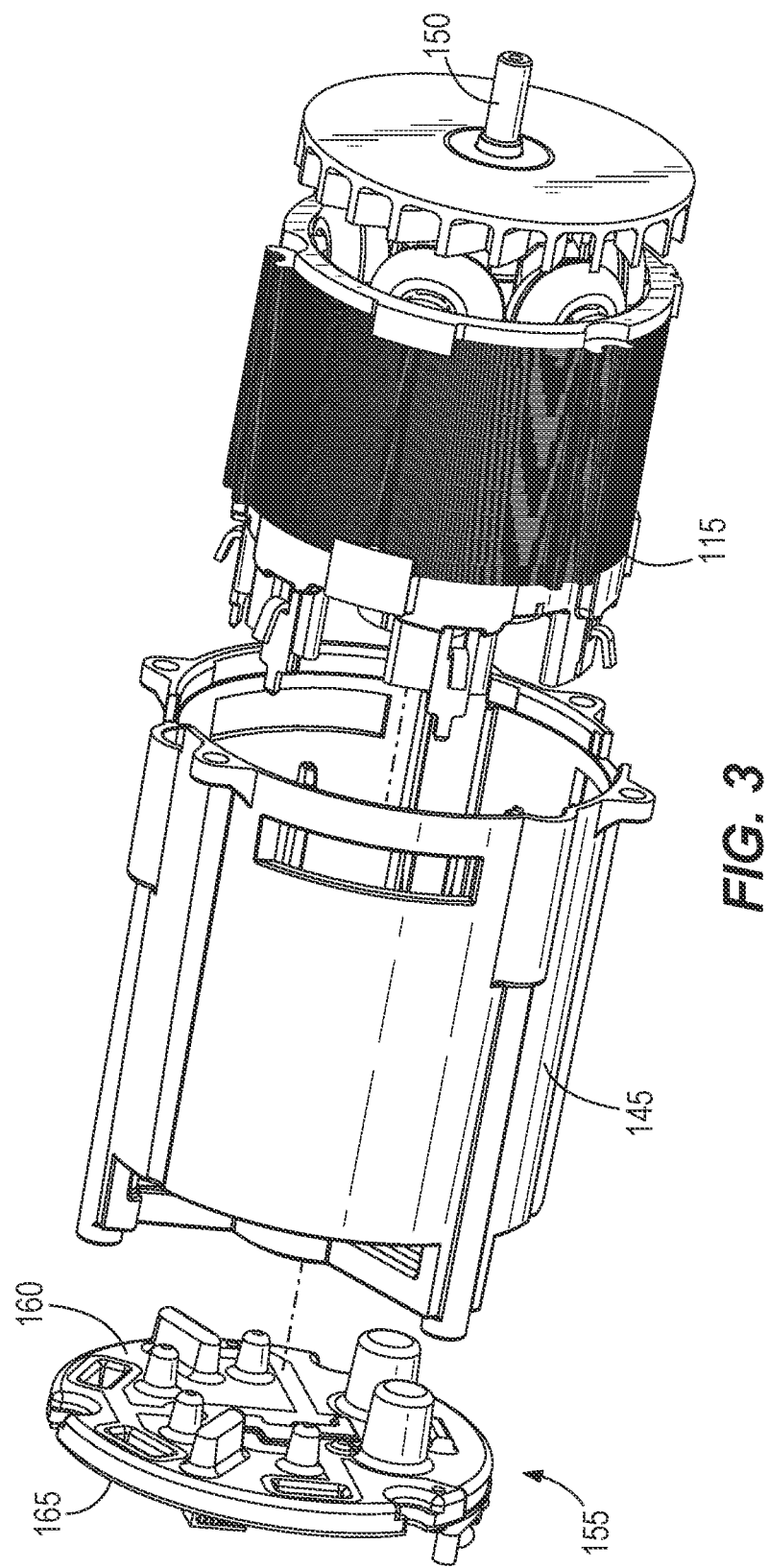
FIG. 3 is an exploded view of the motor assembly of FIGS. 2A and 2B.

With reference to FIGS. 2A to 3, a motor assembly 140 is shown including a motor housing 145, the motor 115 positioned within the motor housing 145, and a PCB assembly 155 coupled to an end of the motor housing 145 opposite the end from which the shaft 150 protrudes. The PCB assembly 155 is fastened to the motor housing 145 by fasteners 170 (FIG. 3) equally spaced about the periphery of the motor housing 145. The PCB assembly 155 includes a heat sink 160, a power PCB 165 disposed on a rear side of the heat sink 160, and a position sensor PCB 355 disposed on an opposite side of the heat sink 160. The power PCB 165 includes the FETs 110 and a connection terminal that is connected to the power source 105 and the Hall-effect sensors 120. In the illustrated embodiment, the power PCB 165 is coupled to the heat sink 160 by fasteners 167. In some embodiments, rather than being attached to the motor housing 145, the power PCB 165 may be located on a casting elsewhere within the power tool 100. For example, the power PCB 165 may be located in a handle portion of the power tool housing or adjacent the motor assembly 145 in a motor housing portion of the power tool.

Figure 7:
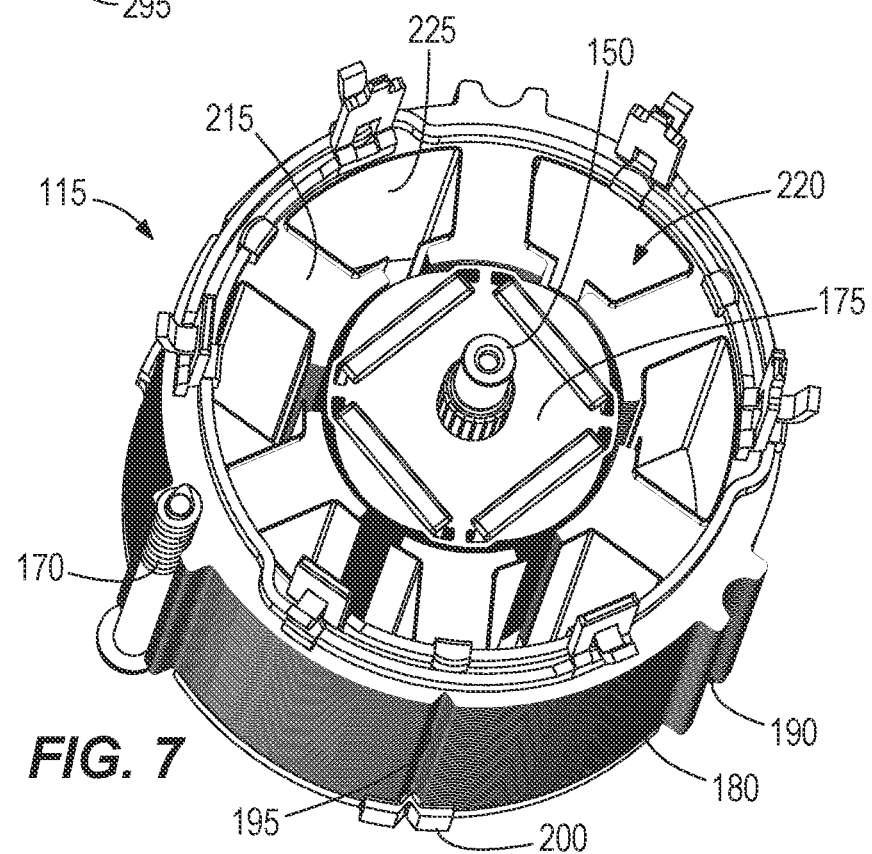
FIG. 7 is another front perspective view of the motor of FIG. 4 with portions removed.
Figure 8:
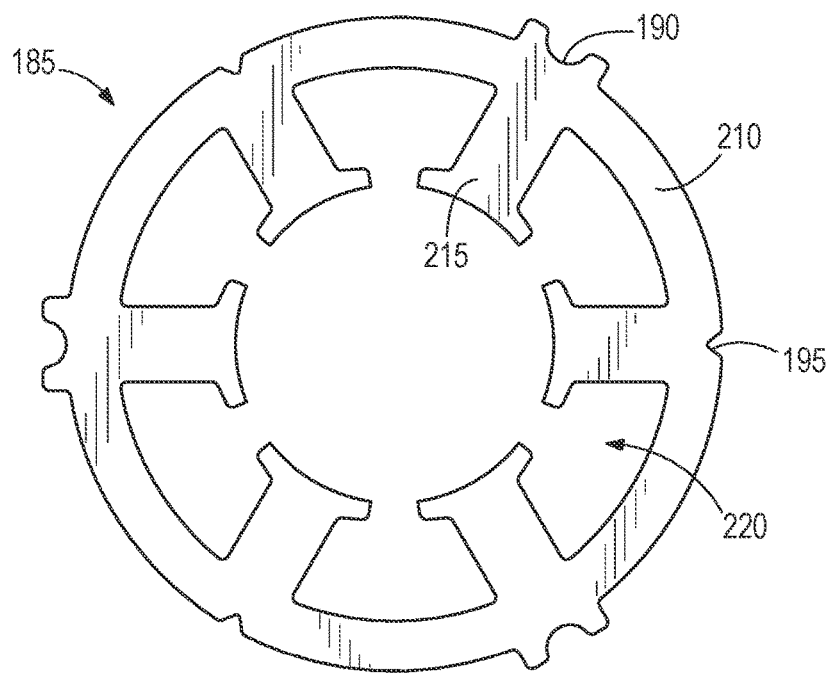
FIG. 8 is a plan view of a stator lamination of the motor of FIG. 4.
Figure 9:
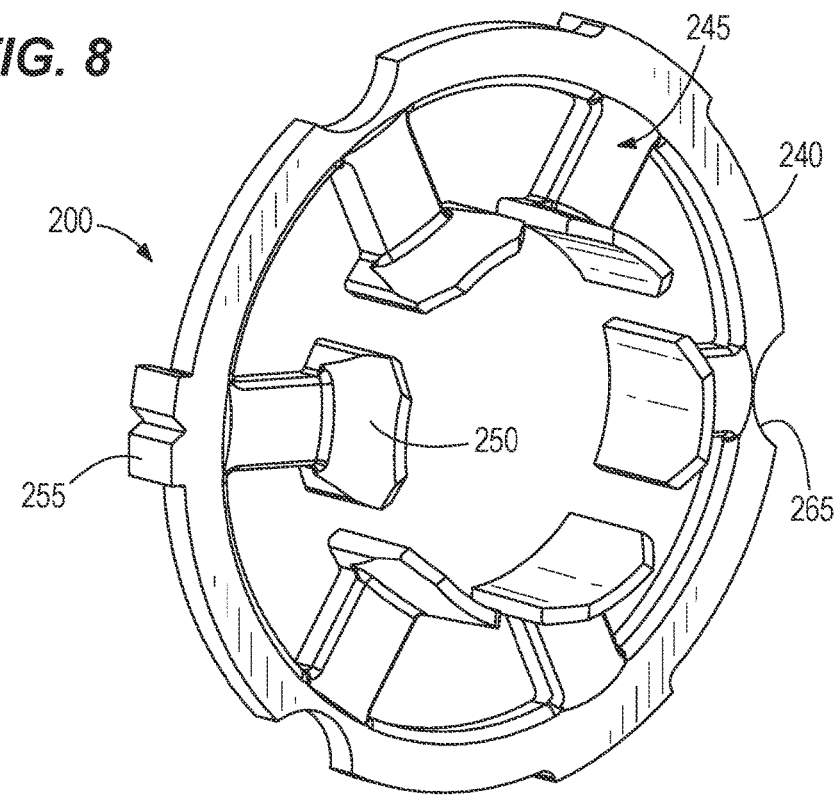
FIG. 9 is a front perspective view of a front end cap of the motor of FIG. 4.
Figure 10:
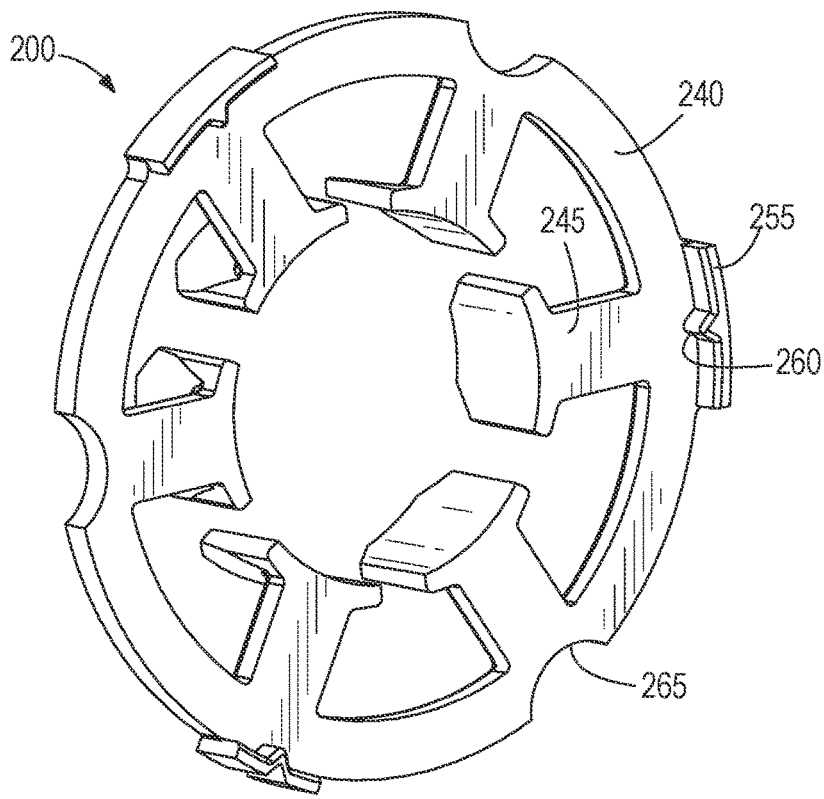
FIG. 10 is a rear perspective view of the front end cap of FIG. 9.
Figure 11:
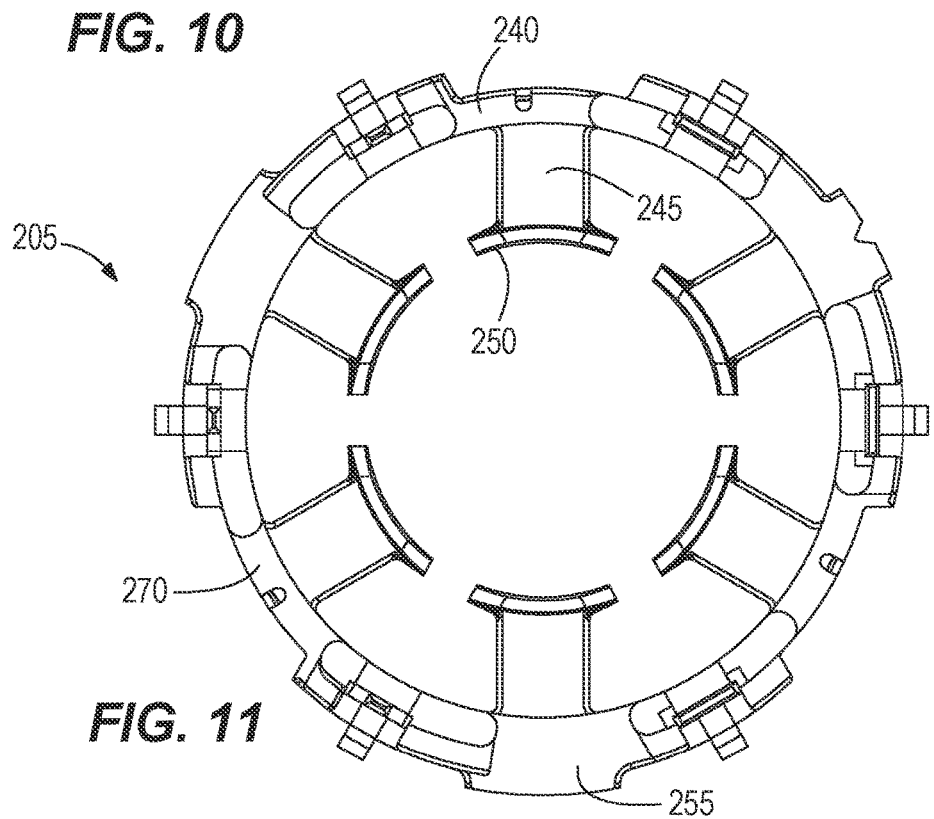
FIG. 11 is a front view of a rear end cap of the motor of FIG. 4.
Figure 12:
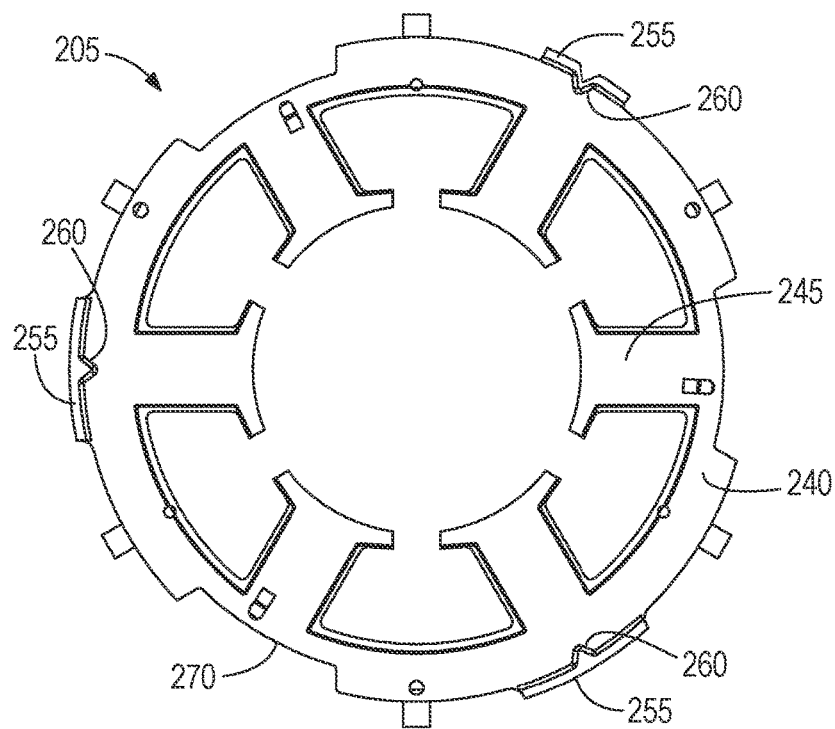
FIG. 12 is a rear view of the rear end cap of FIG. 11.

With reference to FIG. 7, the motor 115 includes a rotor 175 from which the shaft 150 extends and a stator 180 (FIG. 4) surrounding the rotor 175. The stator 180 includes individual stator laminations 185 that are stacked together to form a stator core 235. The stator 180 includes radially outward-extending ribs 190 on the outer surface of the stator core 235 that extend the entire length of the stator core 235. Adjacent ribs 190 define a concave channel 295 through which the fasteners 170 extend. In addition, the stator 180 also includes recesses 195, the purpose of which is described below, that extend parallel with the ribs 190 and that are rotationally offset from the ribs 190. With reference to FIG. 8, each stator lamination 185 includes a rim 210 having multiple radially outward-extending protrusions that collectively define the ribs 190 when the laminations 185 are stacked, and recesses 195 defined on the outer surface of the rim 210. The stator 180 also includes inwardly extending stator teeth 215 and slots 220 defined between each pair of adjacent stator teeth 215. An insulating member 225 (FIG. 7) is provided in the slots 220 to insulate the stator teeth 215 from coil windings (not shown).

Figure 4:
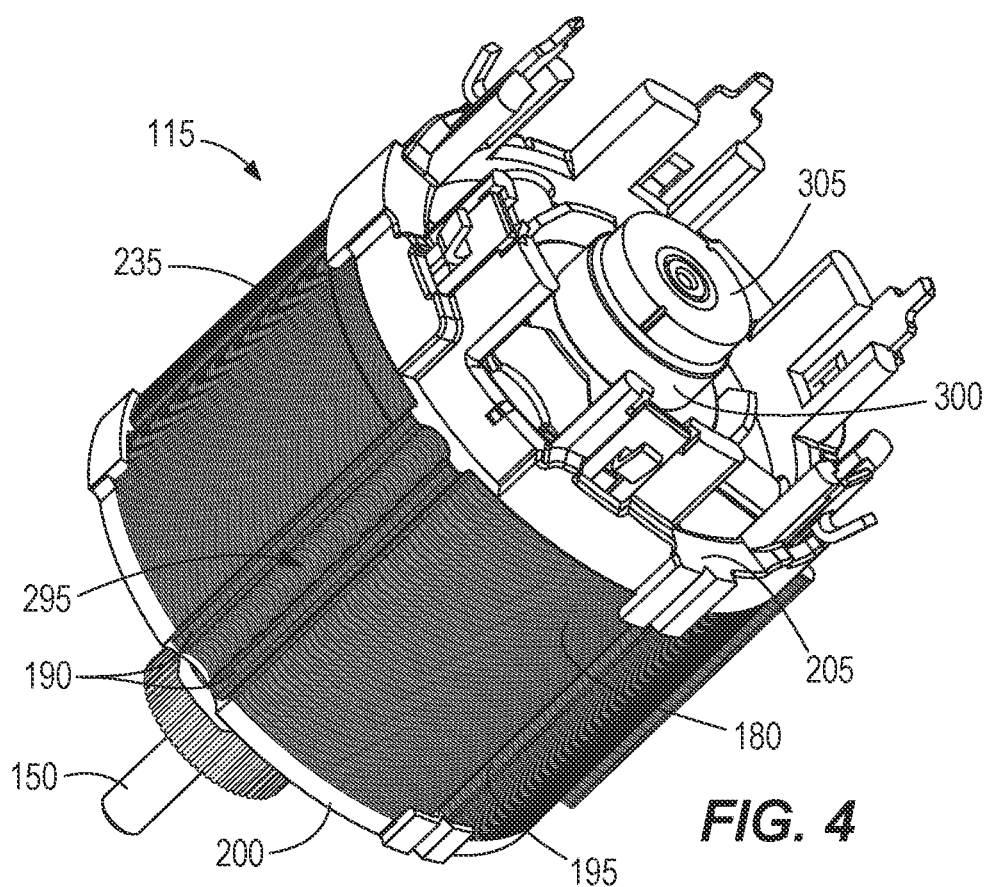
FIG. 4 is a perspective view of the brushless DC motor in the motor assembly of FIG. 3.

With reference to FIG. 4, the motor 115 also includes a permanent ring magnet 305 mounted on the rear of the rotor shaft 150. The ring magnet 305 is affixed to the rotor shaft 150 and co-rotates with the rotor shaft 150, emanating a rotating magnetic field that is detectable by the Hall-effect sensors 120. The ring magnet 305 is rotationally aligned with the magnets of the rotor 175.

The stator 180 includes a front end cap 200 adjacent a front end of the stator core 235 and a rear end cap 205 adjacent a rear end of the stator core 235. With reference to FIGS. 9-14, the front end cap 200 and the rear end cap 205 each include rim portions 240 and end cap teeth 245 extending radially inward from the rim portions 240. The end cap teeth 245 include projections 250 that prevent the respective coil windings from slipping off the stator teeth 215 and the end cap teeth 245. Each of the front end cap 200 and the rear end cap 205 additionally includes tabs 255 extending transversely from the rim portions 240, with each tab 255 including a radially inward extending projection 260 (FIG. 12) that is received in a respective recesses 195 of the stator core 235 to rotationally align the front end cap 200 and the rear end cap 205 relative to the stator core 235. The front end cap 200 includes concave recesses 265 (FIGS. 9 and 10) that are aligned with the channels 295 in the stator core 235 through which the fastener 170 extend. The rear end cap 205 includes recessed portions 270 (FIGS. 11 and 12) that receive respective poles 330 (FIG. 17) of the motor housing 145 to rotationally align the rear end cap 205 relative to the stator core 235.

Figure 13:
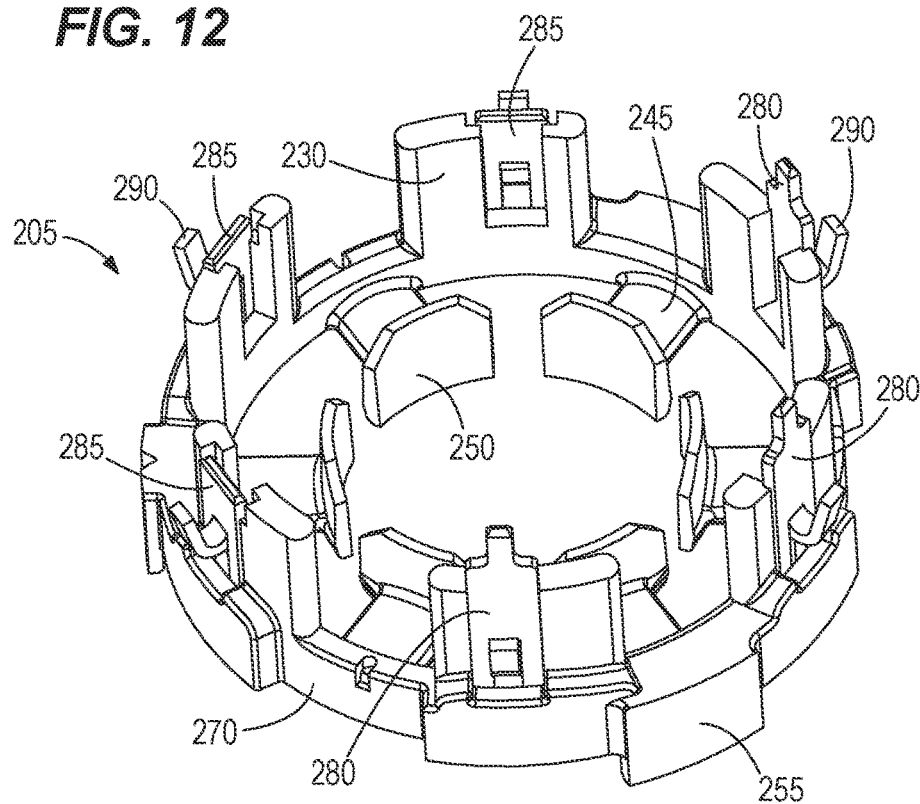
FIG. 13 is a perspective view of the rear end cap of FIG. 11 with coil contact plates overmolded therein.
Figure 14:
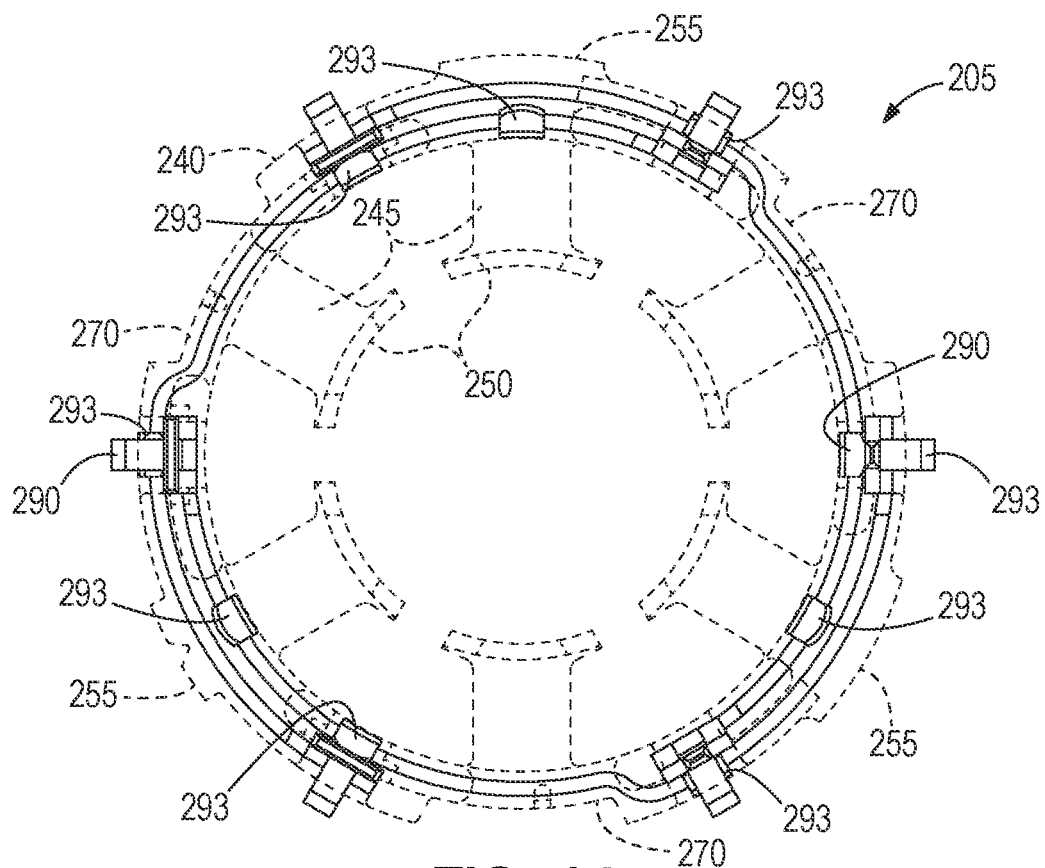
FIG. 14 is a front view of the rear end cap and coil contact plates of FIG. 13, illustrating the rear end cap in a transparent state.
Figure 15:
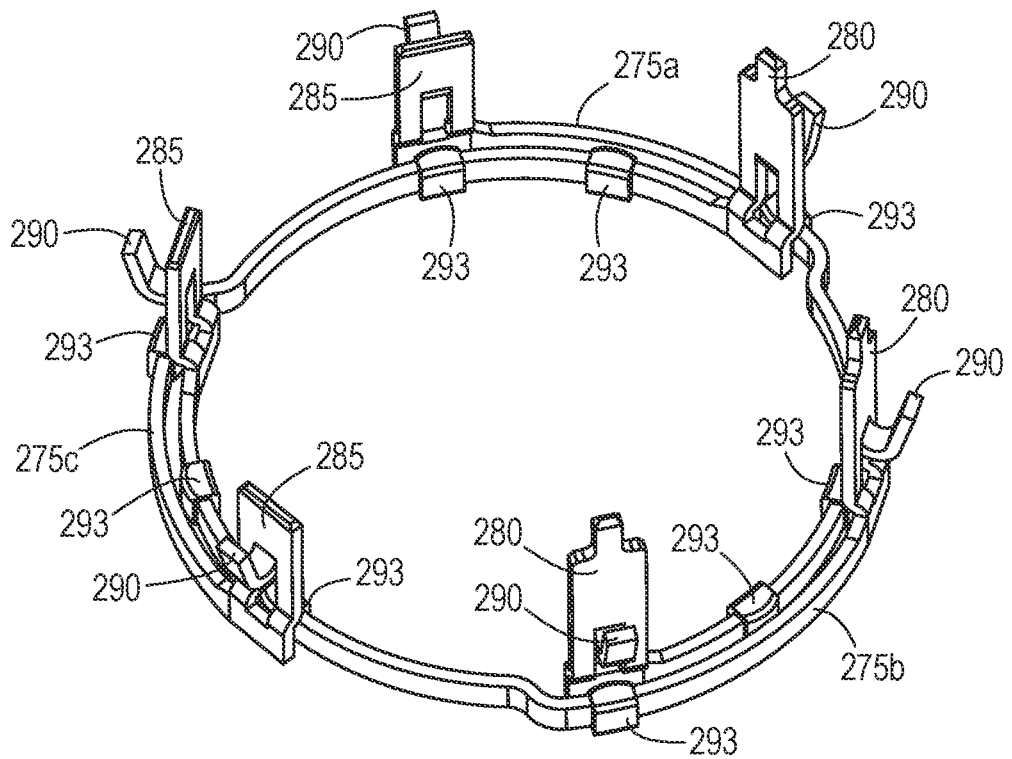
FIG. 15 is a perspective view of the coil contact plates of FIG. 13.

During assembly of the stator 180, stator windings are wound around the stator teeth 215 and the end cap teeth 245. The stator windings are guided between adjacent stator teeth 215 by wire guiding tabs 230 on the rear end cap 205 (FIG. 13). The stator 180 also includes coil contact plates 275a, 275b, and 275c (also referred interchangeably herein as coil contact plates 275) that short-circuit diagonally opposite pairs of coil windings (FIGS. 14-15). With reference to FIGS. 14 and 15, the coil contact plates 275 are generally semi-circular in shape and staggered to avoid contact between adjacent coil contact plates 275. In particular, the first coil contact plate 275a is positioned radially inward of the second coil contact plate 275b, and the first coil contact plate 275a is positioned radially outward of the third coil contact plate 275c. Each of the coil contact plates 275 includes a first terminal 280 and a second terminal 285 diagonally opposite the first terminal 280. Stator windings are connected to hooks 290 on the respective terminals 280, 285. With reference to FIG. 2A, the first terminals 280 extend through the heat sink 160 and are electrically connected to the power PCB 165, while the second terminals 285 do not protrude through the heat sink 160. Particularly, the terminals 280 of the coil contact plates 275a, 275b, 275c are connected, respectively, to the U, V, W phases of the inverter bridge (i.e., FETs 110). The first and second terminals 280, 285 and the hooks 290 protrude from the guiding tabs 230. In some embodiments, where the power PCB 165 is located elsewhere within the power tool 100 as described above, the coil contact plates 275 may be connected to the power PCB 165 by lead wires. Lead wires may be connected to the first terminals 280 (e.g., to holes in the first terminals 280) and routed to the power PCB 165 within the power tool housing.

With continued reference to FIGS. 14 and 15, a plurality of spacers 293 are coupled to the coil contact plates 275. At least some of the spacers 293 are positioned between adjacent coil contact plates 275 in order to create and maintain an insulating gap (e.g., a space) between the adjacent coil contact plates 275. In some embodiments, the plurality of spacers 293 are equally spaced circumferentially around the coil contact plates 275. The spacers 293 are pre-molded onto the coil contact plates 275 before the coil contact plates 275 are overmolded as discussed in further detail below. In particular, each of the spacers 293 are molded on one of the coil contact plates 275. In the illustrated embodiment, the spacers 293 include a first spacer positioned between the first and second adjacent coil contact plates 275a, 275b, and a second spacer 293 positioned between the adjacent first and third coil contact plates 275a, 275c. As such, insulating gaps are created between the adjacent coil contact plates 275.

The pre-molded spacers 293 prevent internal shorts between coil contact plates 275 and portions of the coil contact plates 275 being exposed. In other words, the relative spacing between adjacent coil contact plates 275 may be difficult to adequately control during an injection molding process, and the coil contact plates 275 may deform during the molding process from the injection pressure. This deformation of the coil contact plates 275 can cause internal shorts or exposure. By adding the pre-molding spacers 293, deformation of the coil contact plates 275 while being overmolded is prevented.

With reference to FIGS. 13 and 14, the coil contact plates 275 and the spacers 283 are overmolded in the rear end cap 205. In some embodiments, the front end cap 200 and the rear end cap 205 may be manufactured separately from the stator core 235, positioned relative to the stator core 235 using the tabs 255 and the recesses 195, and then retained to the stator core by the coil windings. In such an embodiment, the coil contact plates 275 may be overmolded by the rear end cap 205 using, for example, an insert molding process. In other embodiments, the stator core 235 and the coil contact plates 275 may be insert molded together, for example, using an injection molding process. In such an embodiment, the mold material defining each of the end caps 200, 205 may also overlie one or multiple of the laminations 185 in the front and the rear of the stator core 235. In both embodiments, because the coil contact plates 275 are molded within the rear end cap 205, separate means of attaching the coil contact plates 275 to the end cap 205 is unnecessary. Also, the entire circumferential length of the coil contact plates 275 is insulated within the non-conductive mold material comprising the rear end cap 205, thereby reducing the likelihood of corrosion of the coil contact plates 275 if the motor 115 is exposed to wet or damp environments.

Figure 16:
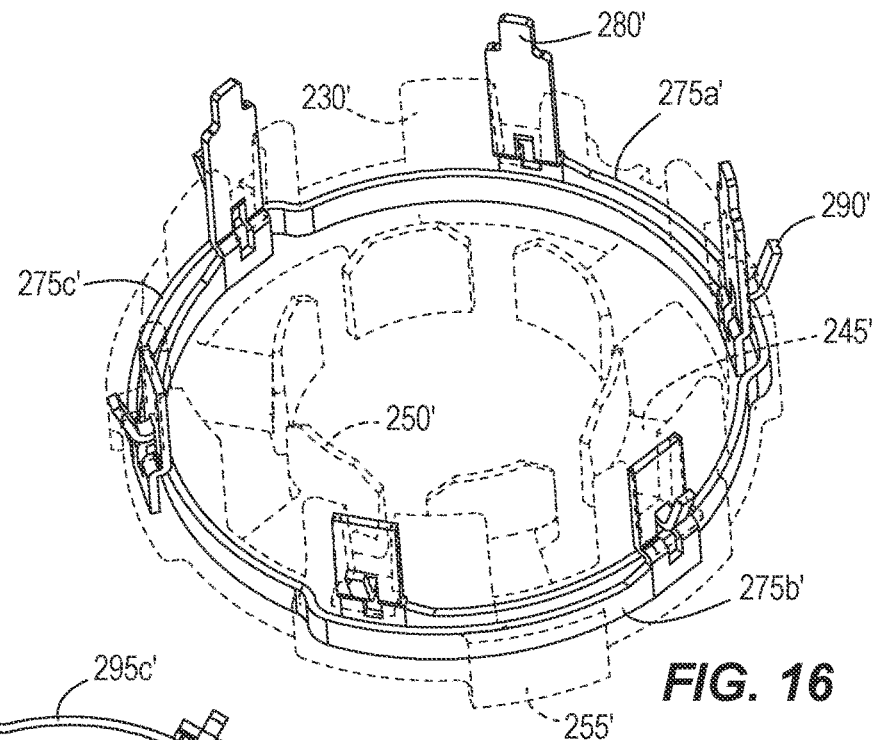
FIG. 16 is a perspective view of a rear end cap and coil contact plates according to another embodiment, illustrating the rear end cap in a transparent state.
Figure 17:
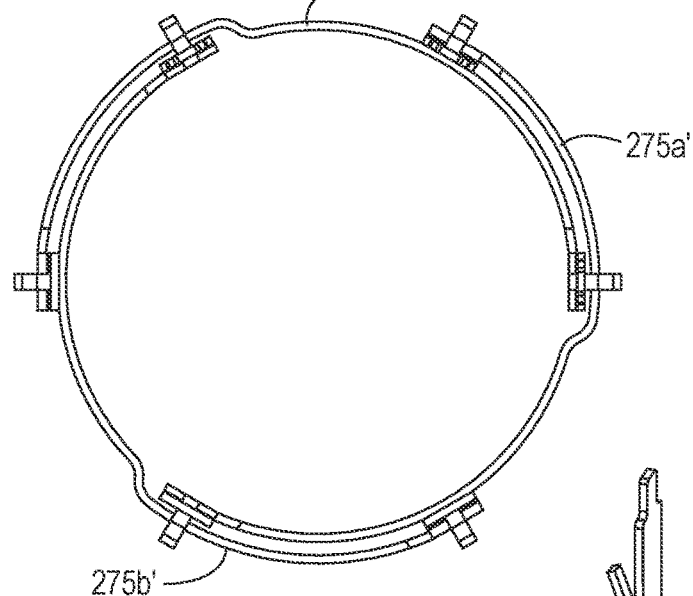
FIG. 17 is a plan view of the coil contact plates shown in FIG. 16 with the rear end cap removed.
Figure 18:
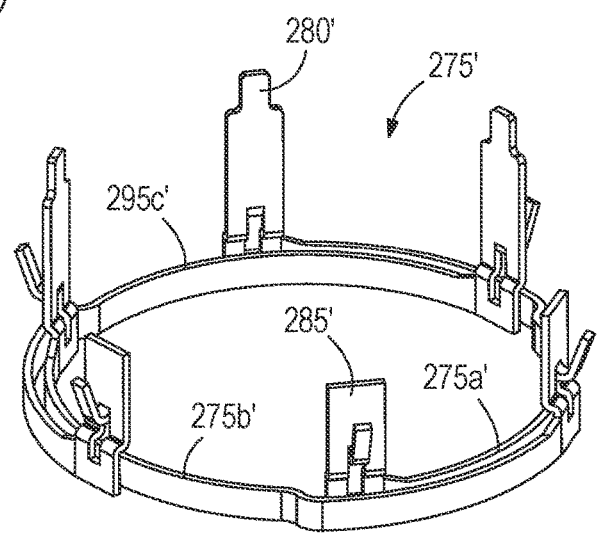
FIG. 18 is a perspective view of the coil contact plates of FIG. 17.
Figure 19:
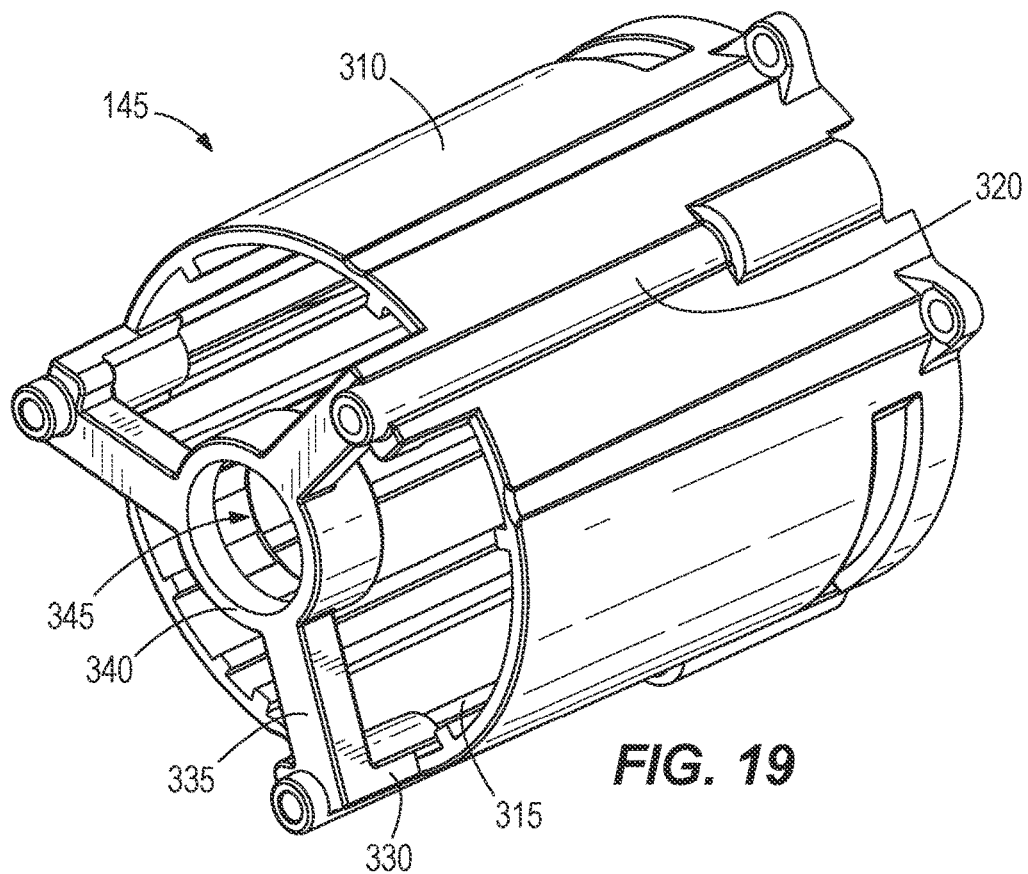
FIG. 19 is a rear perspective view of a motor housing of the motor assembly of FIG. 2.

With reference to FIGS. 16-18, a rear end cap 205' according to another embodiment includes features similar to the rear end cap 205 identified with the same references numerals appended with an ('). In particular, the rear end cap 205' includes three coil contact plates 275a', 275b', and 275c'. In this embodiment, there are no spacers (similar to spacers 293) included.

Figure 15A:
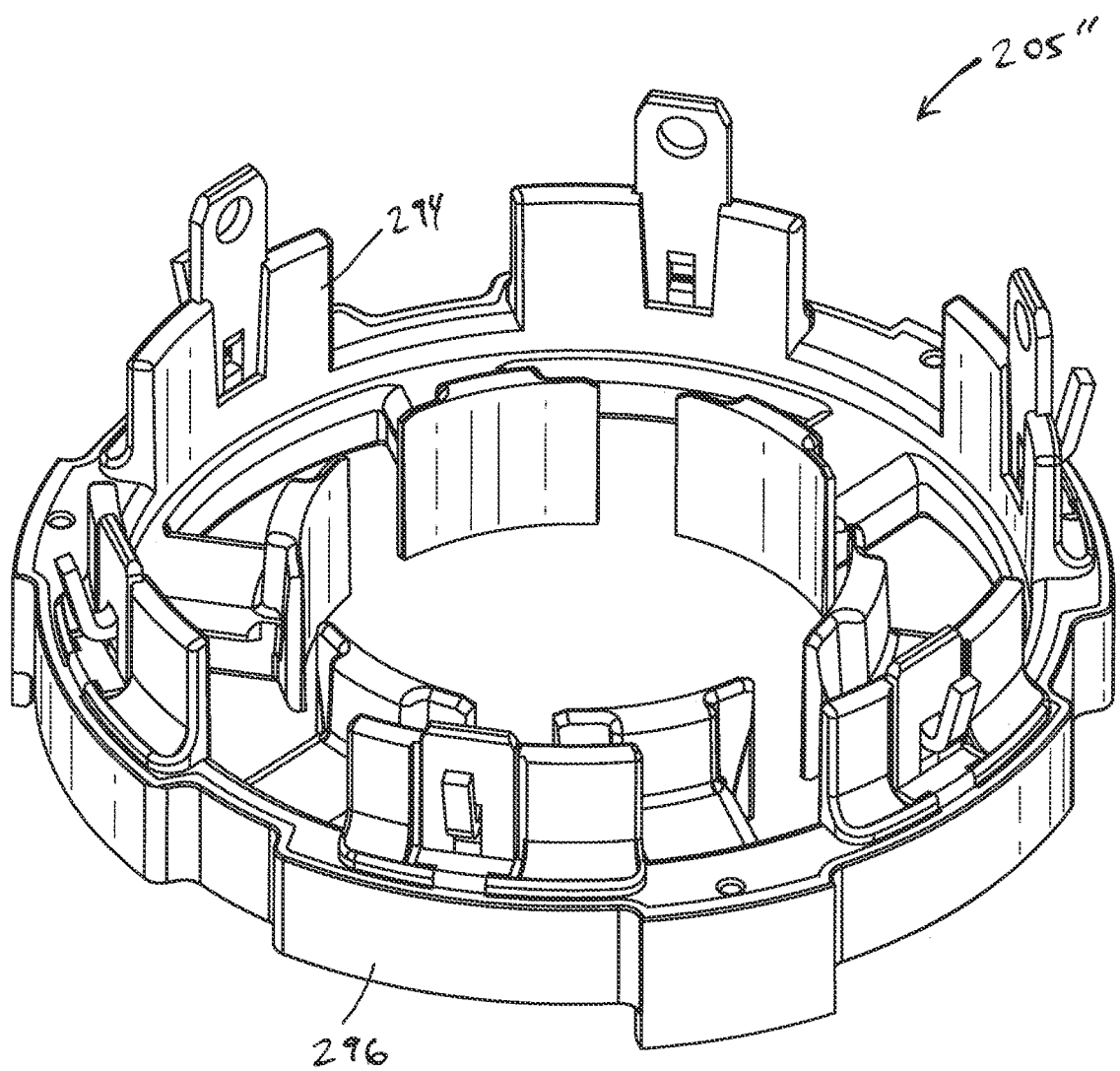
FIG. 15A is a perspective view of an alternative embodiment of the rear end cap of FIG. 13.

With reference to FIG. 15A, another embodiment of a rear end cap 205", which may be used in place of the end cap 205 of FIG. 13, is shown with like reference numerals with two appended prime markers (") being associated with like components in the end cap 205. In the rear end cap 205" of FIG. 15A, the coil contact plates 275" are first positioned in a pre-molded annular carrier 294 prior to being positioned in a mold for applying an outer resin layer 296 to the pre-assembled carrier 294 and coil contact plates 275".

Figure 15B:
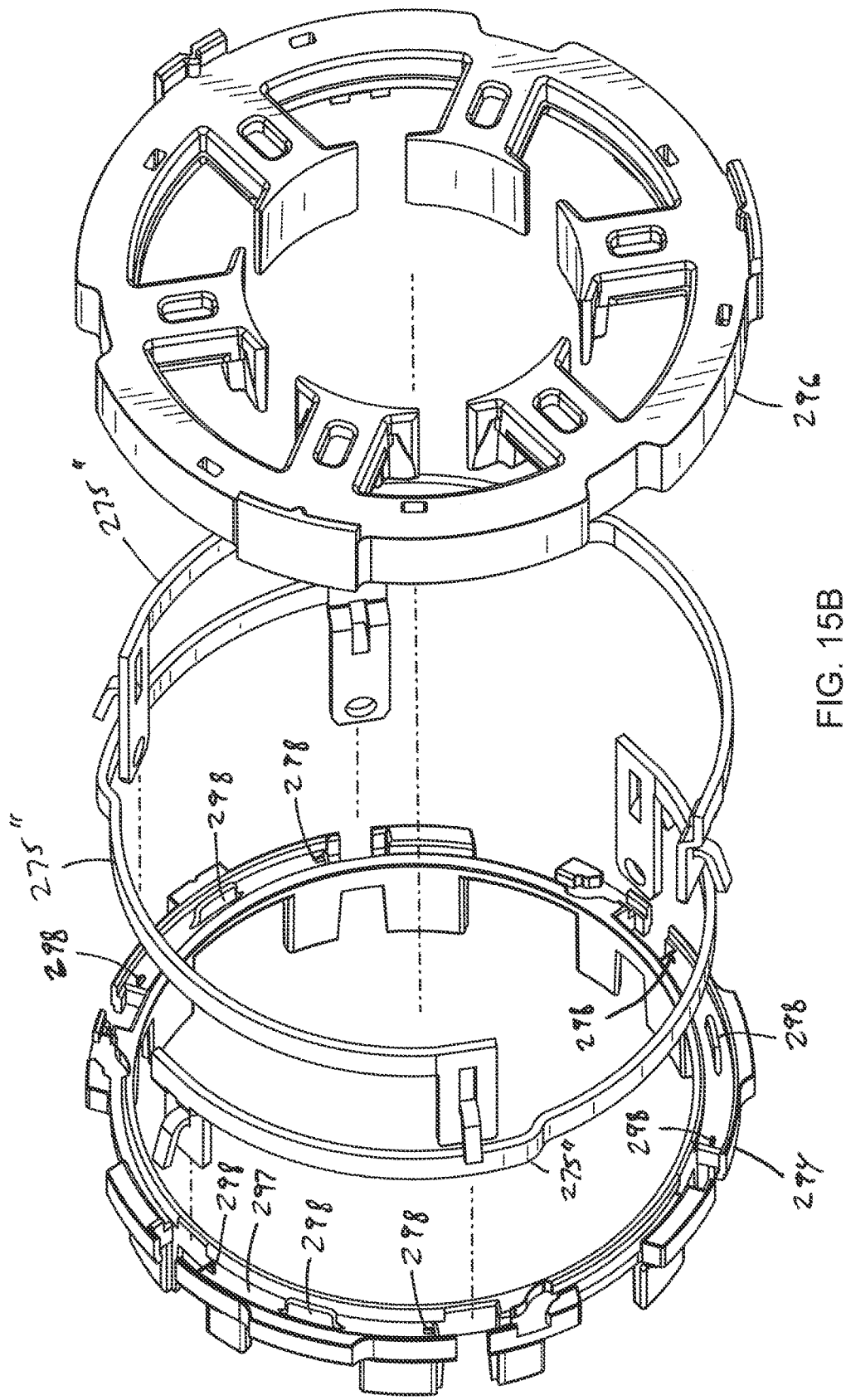
FIG. 15B is a rear exploded view of a portion of the rear end cap of FIG. 15A.

The carrier 294 includes a single circumferential groove 297 defined in a side of the end cap 205" facing the stator core 235 in which the coil contact plates 275" are positioned (FIG. 15B). A plurality of ribs 298 are located in the groove 297 for maintaining an air gap between adjacent coil contact plates 275", thereby preventing relative movement between the plates 275" during an injection molding process to apply the resin layer 296 that might otherwise cause two adjacent plates 275" to come into contact and short.

Figure 20:
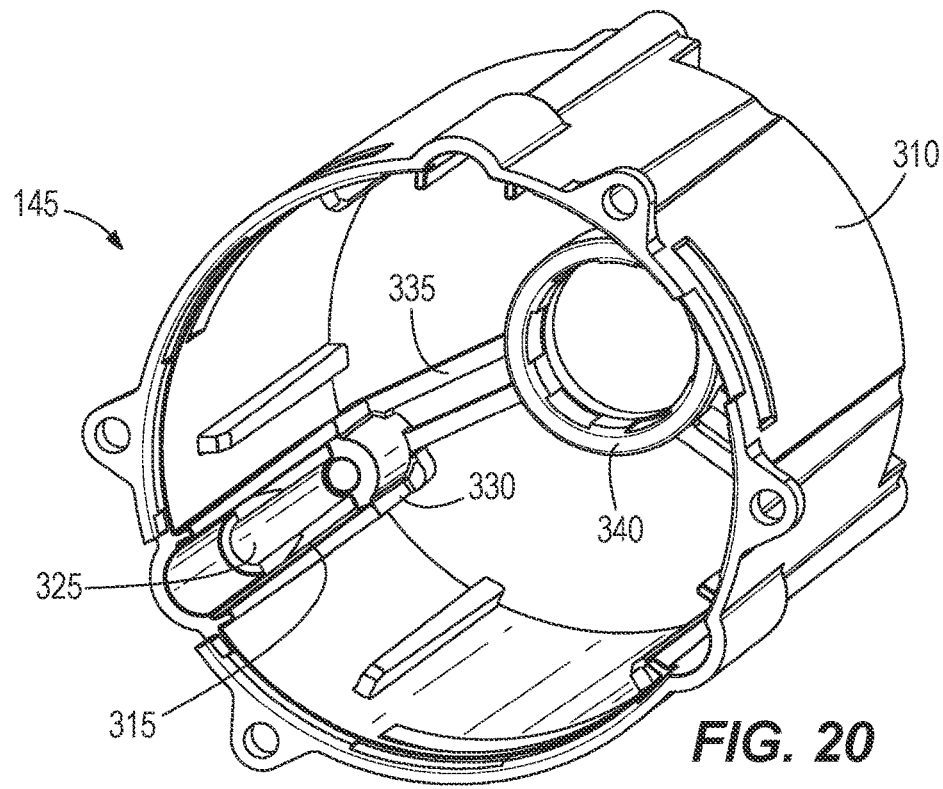
FIG. 20 is a front perspective view of the motor housing in accordance with some embodiments.
Figure 21:
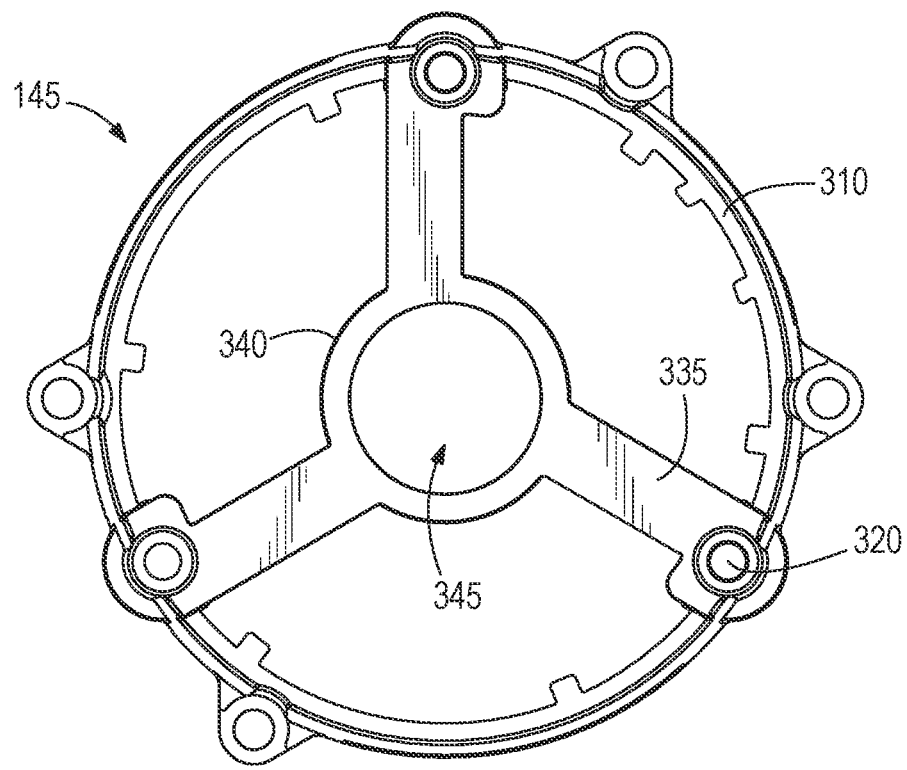
FIG. 21 is a rear view of the motor housing of FIG. 19.
Figure 22:
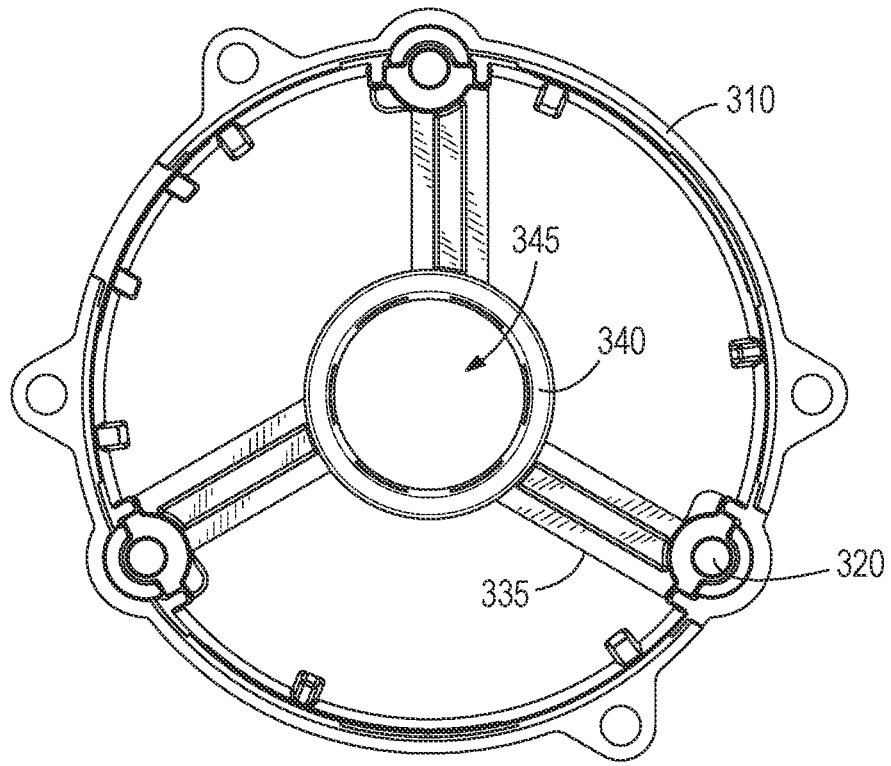
FIG. 22 is a front view of the motor housing of FIG. 19.

With reference to FIGS. 19-22, the motor housing 145 includes a cylindrical portion 310 that houses the motor 115. Mounting bosses 320 are provided along the cylindrical portion 310 through which the fasteners 170 extend to interconnect the PCB assembly 155 to the motor housing 145. The motor housing 145 also includes a hub portion 340 coaxial with the cylindrical portion 310 and axially spaced from the cylindrical portion 310, posts 330 extending axially from a rear end of the cylindrical portion 310, and radially extending spokes 335 interconnecting the hub portion 340 to the posts 330. With reference to FIG. 20, the cylindrical portion 310 of the motor housing 145 also includes radially inward-extending ribs 315 extending the entire length of the cylindrical portion 310, with each pair of adjacent ribs 315 defining a channel 325 therebetween. When the motor 115 is inserted into the motor housing 145, the adjacent ribs 190 on the motor 115 are slidably received within the respective channels 325 defined in the cylindrical portion 310, thereby rotationally orienting the motor 115 relative to the motor housing 145.

Figure 5:
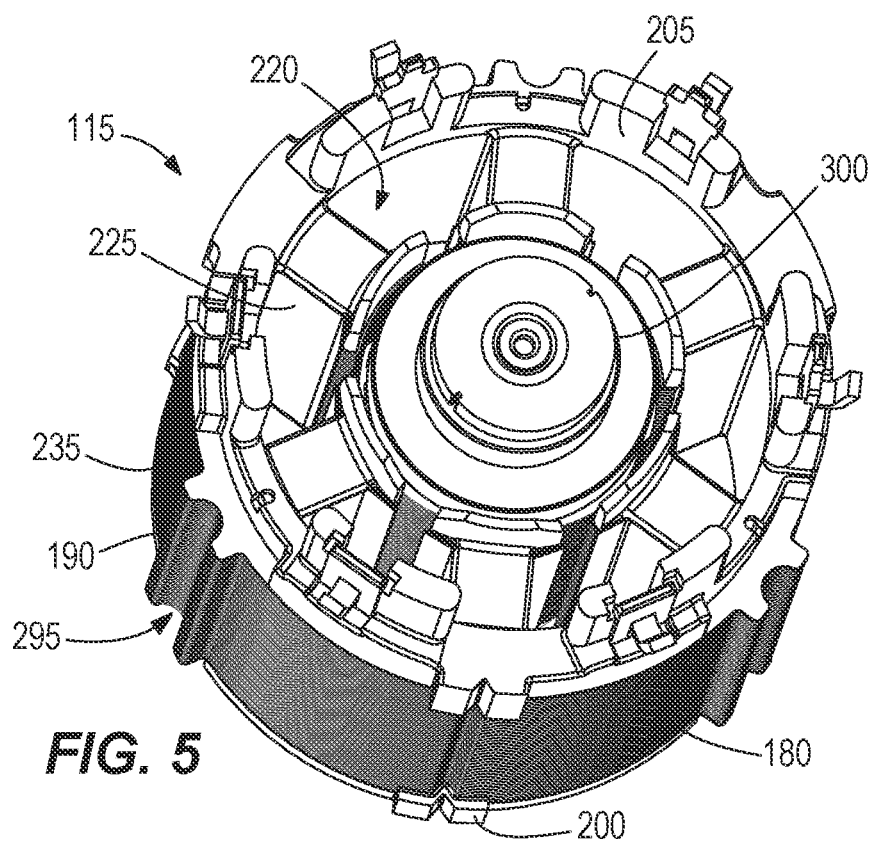
FIG. 5 is a front perspective view of the motor of FIG. 4.
Figure 6:
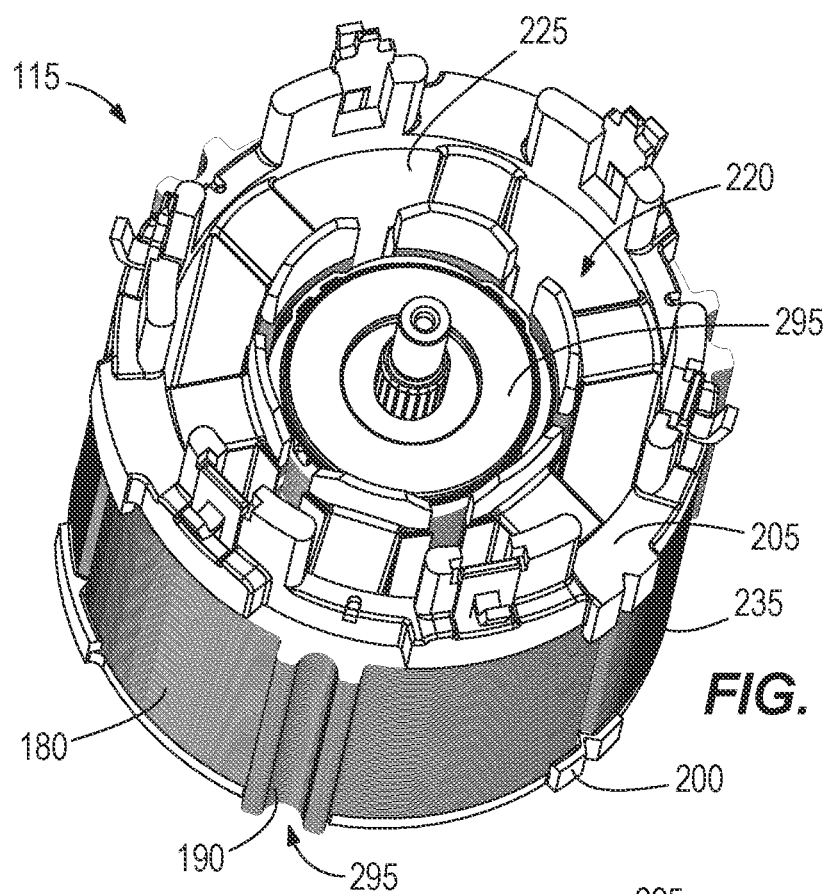
FIG. 6 is another front perspective view of the motor of FIG. 4 with portions removed.
Figure 29:
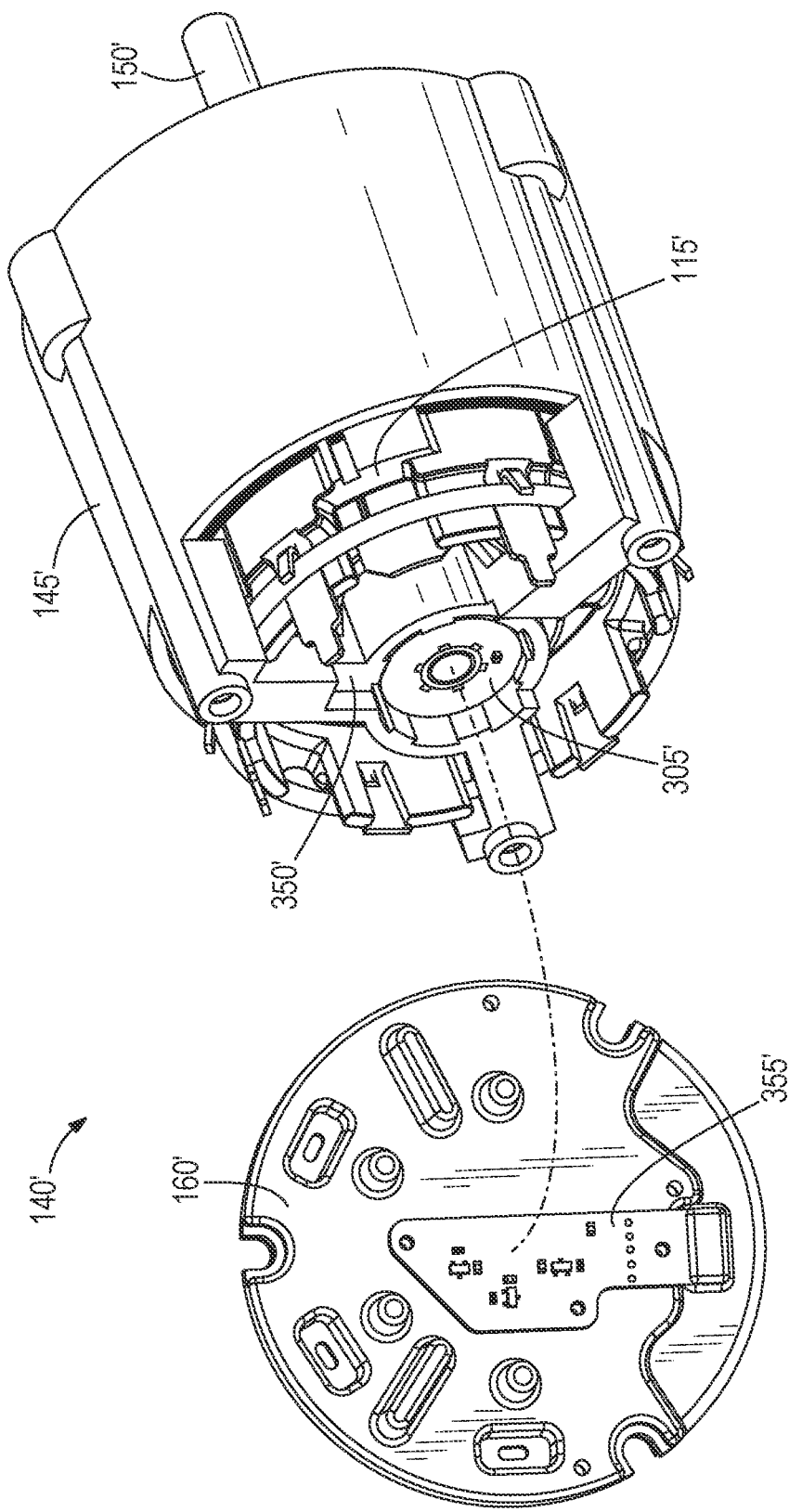
FIG. 29 is a rear perspective view of a motor assembly according to another embodiment, illustrating a PCB assembly exploded from the remainder of the motor assembly.
Figure 30:
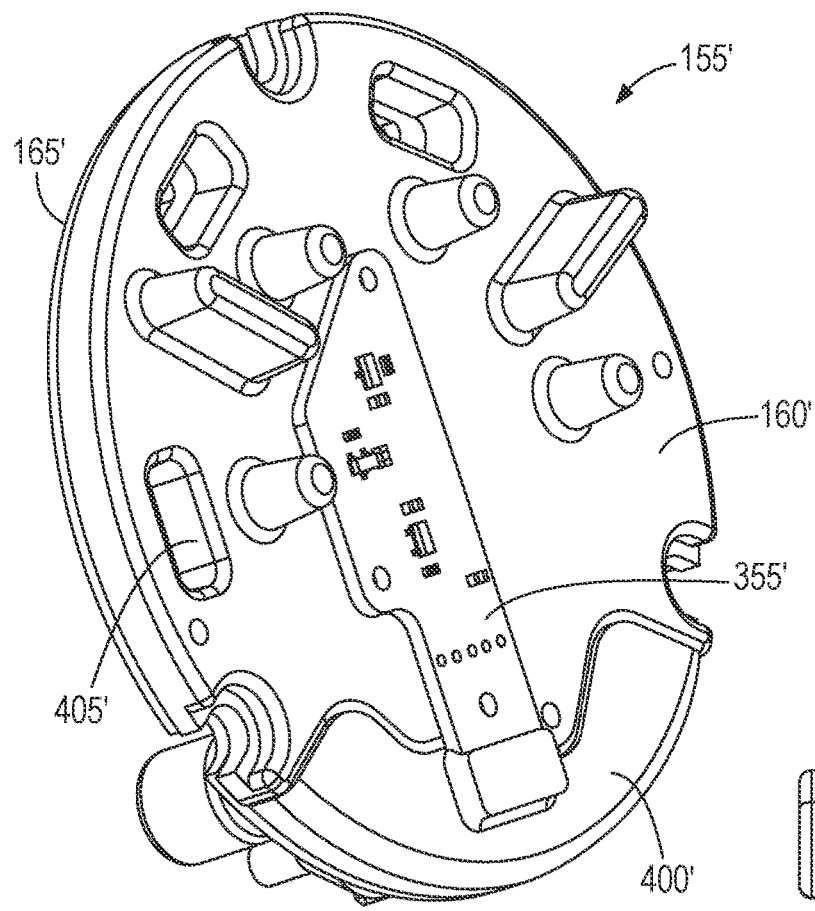
FIG. 30 is a perspective view of the PCB assembly of FIG. 29.
Figure 31:
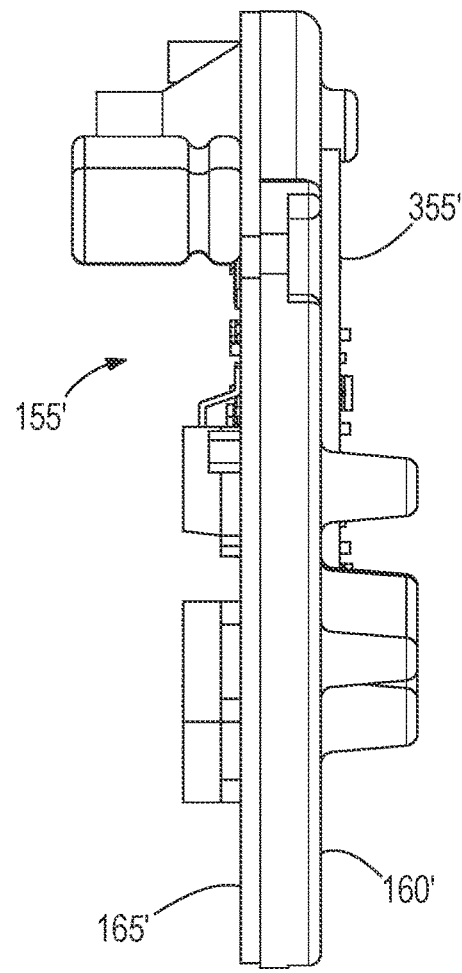
FIG. 31 is a side view of the PCB assembly of FIG. 30.
Figure 32:
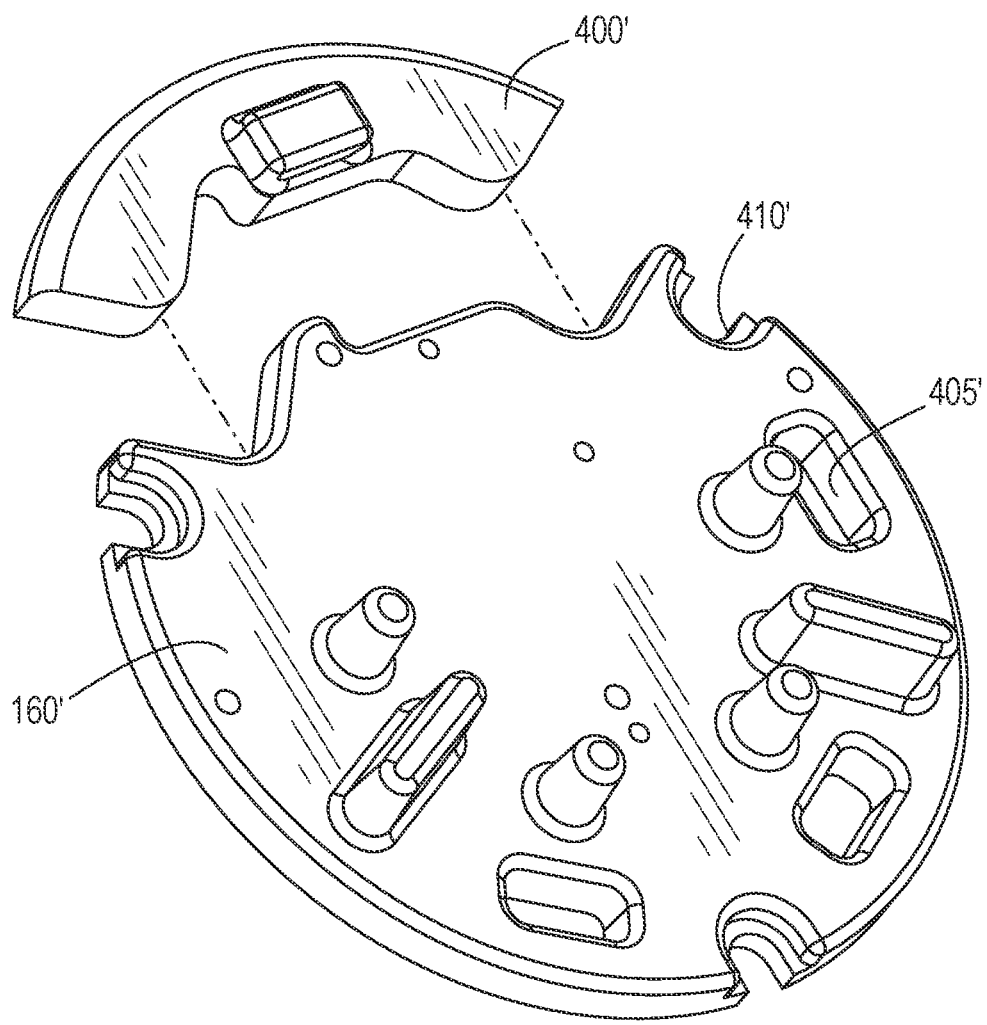
FIG. 32 is a perspective view of a multi-piece heat sink of the PCB assembly of FIG. 21.

With reference to FIGS. 19-22, the hub portion 340 defines a central aperture 345 into which a bearing 300 (FIG. 5) for supporting a rear of the rotor shaft 150 is interference-fit and the ring magnet 305 (FIG. 4) is received. In some embodiments, the motor housing 145' may include a recessed portion 350' (FIG. 29) formed in the hub portion 340' and partially along one of the spokes 335' into which a position sensor PCB 355' is at least partially received. The recessed portion 350' allows the position sensor PCB 355' to be located in close proximity and in facing relationship with the ring magnet 305' for accurate readings by multiple Hall-effect sensors 120' on the position sensor PCB 355'.

Figure 27:
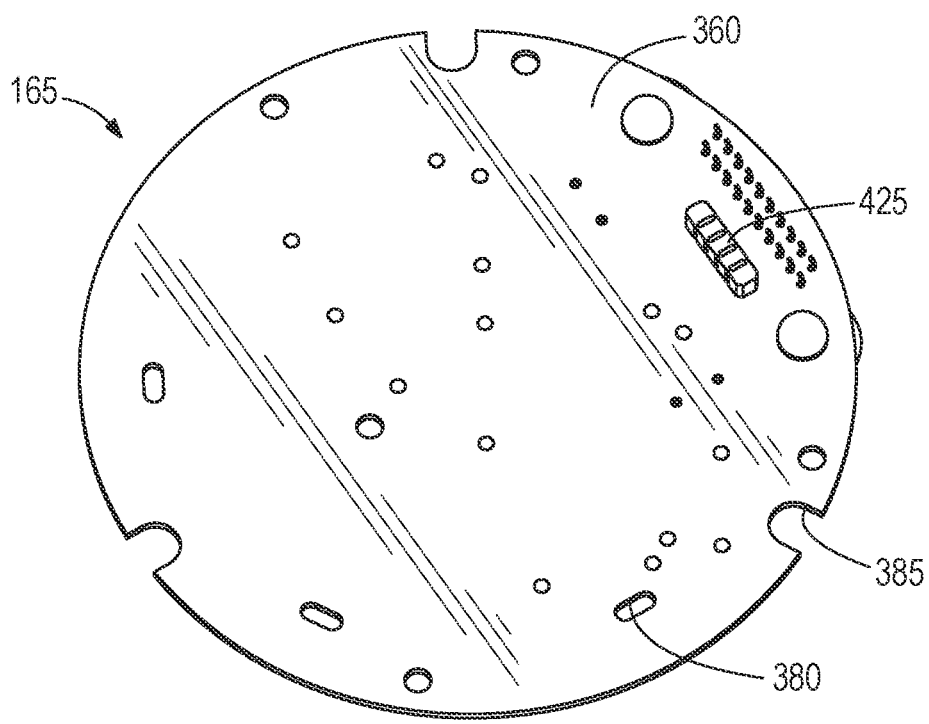
FIG. 27 is a front view of a power PCB of the PCB assembly of FIG. 23.
Figure 28:
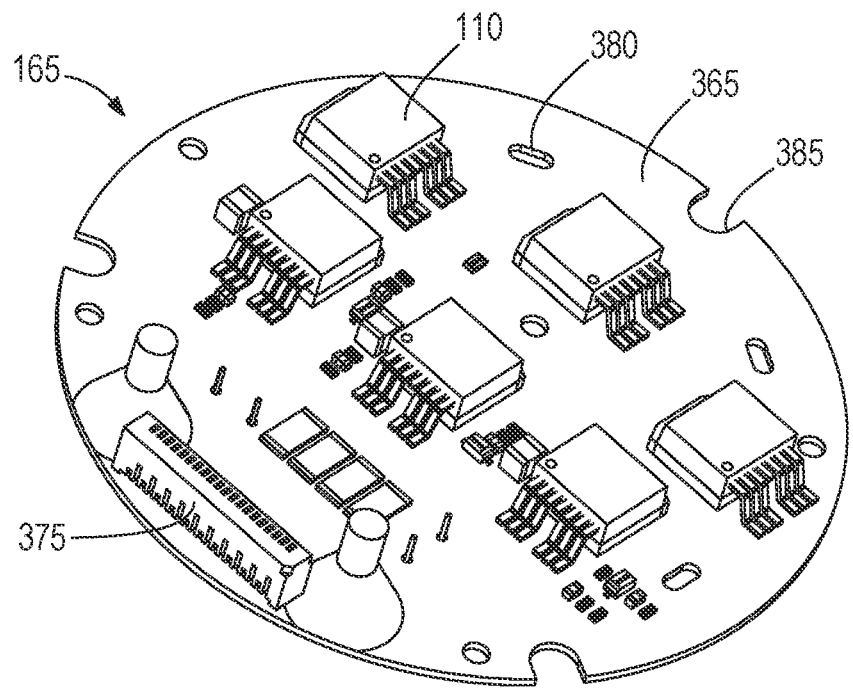
FIG. 28 is a rear perspective view of the power PCB of FIG. 27.

With reference to FIGS. 23-26, the heat sink 160 is sandwiched between the power PCB 165 and the position sensor PCB 355 at the rear of the motor housing 145. In the illustrated embodiment, the position sensor PCB 355 is coupled to the heat sink 160 by fasteners 357. In the illustrated embodiment, there are three Hall-effect sensors 120 on the position sensor PCB 355. Alternatively, there may be other numbers of Hall-effect sensors 120 (e.g., two, four, etc.). With reference to FIGS. 27 and 28, the power PCB 165 includes a first, generally flat surface 360 facing the heat sink 160 and a second surface 365 opposite the first surface 360. The FETs 110 and capacitors 370 associated with the power PCB 165 are positioned on the second surface 365 (FIG. 28). The first surface 360 is held in contact with the heat sink 160 so that heat generated by the power PCB 165 is transferred by conduction to the heat sink 160, where it is subsequently dissipated.

A connection terminal 375 connecting the FETs 110 to the power source 105 is also positioned on the second surface 365. Connections between the FETs 110, the capacitors 370, and the connection terminal 375 may be routed on the first surface 360 or the second surface 365, for example, by a wiring substrate (e.g., printed electrical traces on the power PCB 165). The power PCB 165 also includes holes 380 through which the terminals 280 of the coil contact plates 275 protrude. The terminals 280 are connected to the U, V, and W terminals of the inverter bridge (i.e., FETs 110), respectively, via printed electrical traces on the power PCB 165. Accordingly, individual electrical wires are not required to electrically connect the FETs 110 to the coil contact plates 275. Additionally, recesses 385 are provided on the outer circumference of the power PCB 165 through which the fasteners 170 extend.

Figure 25:
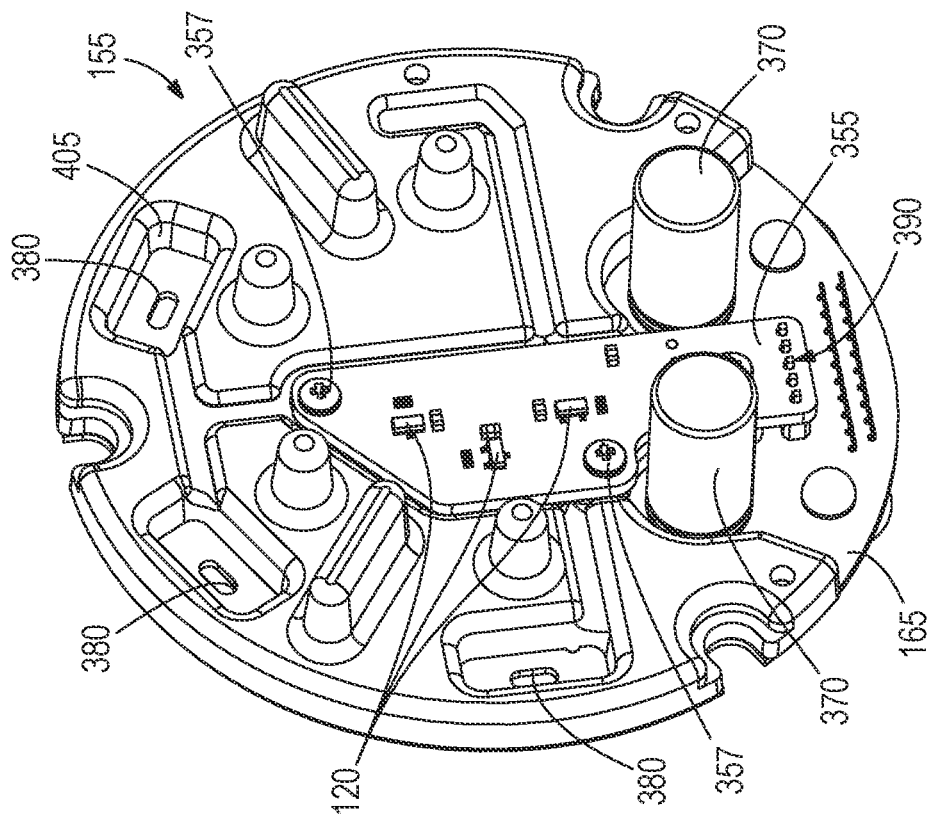
FIG. 25 is a perspective view of the PCB assembly of FIG. 23, with portions removed.

With reference to FIG. 25, the Hall-effect sensors 120 on the position sensor PCB 355 detect the rotating magnetic field emanated by the ring magnet 305. A connection terminal 390 is provided at one end of the position sensor PCB 355 to connect with a mating connection terminal 425 on the first surface 360 of the power PCB 165. In this manner, power is provided to the position sensor PCB 355 via the mating connection terminals 390, 425, and the motor information feedback from the Hall-effect sensors 120 is transmitted to the motor controller 125 via the power PCB 165. The connection between the power PCB 165 and the position sensor PCB 355 is made around an outermost edge of the heat sink 160. In some embodiments, the power PCB 165 and the position sensor PCB 355 may be combined on a single motor controller PCB (not shown). The motor controller PCB may include the Hall-effect sensors 120 on the side facing the ring magnet 305 and the FETs 110 on the side opposite the side with the Hall-effect sensors 120.

Figure 23:
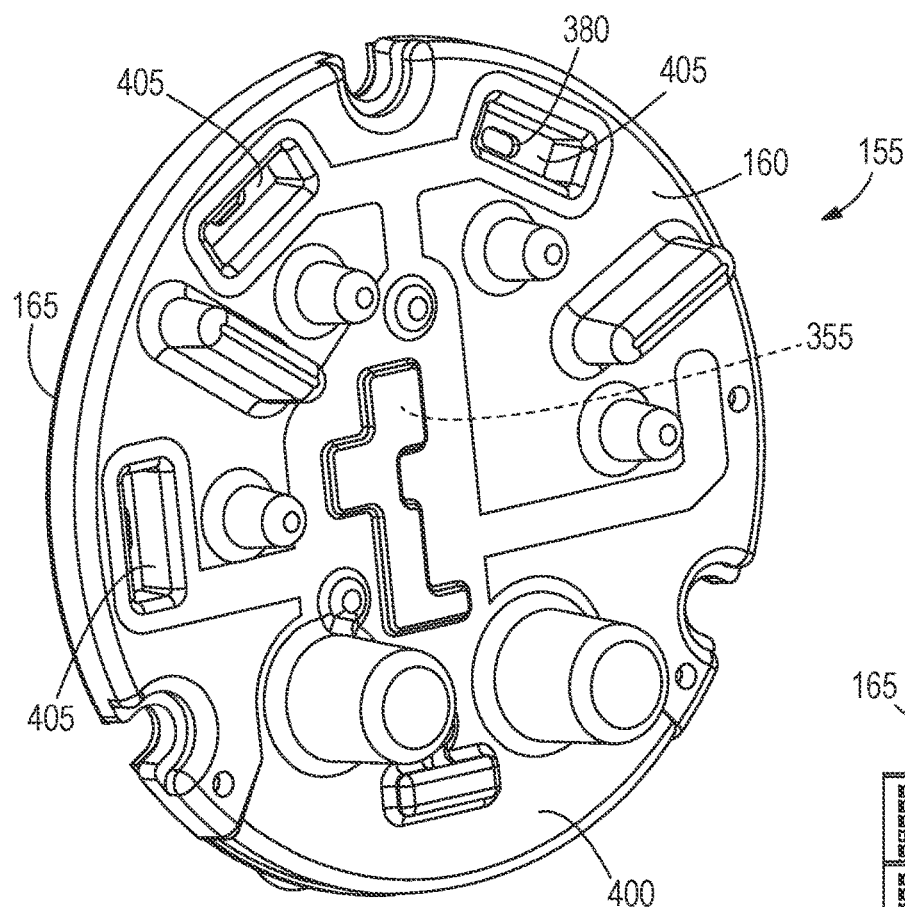
FIG. 23 is a perspective view of a PCB assembly in accordance with some embodiments.
Figure 24:
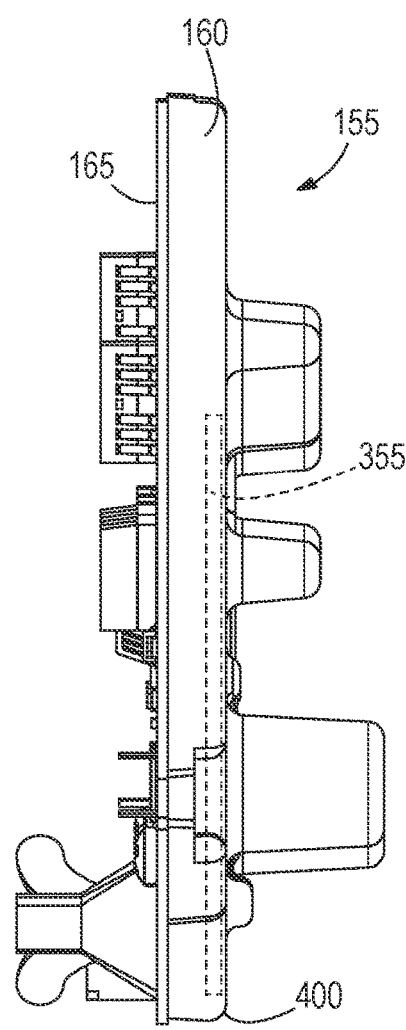
FIG. 24 is a side view of the PCB assembly of FIG. 23.
Figure 26:
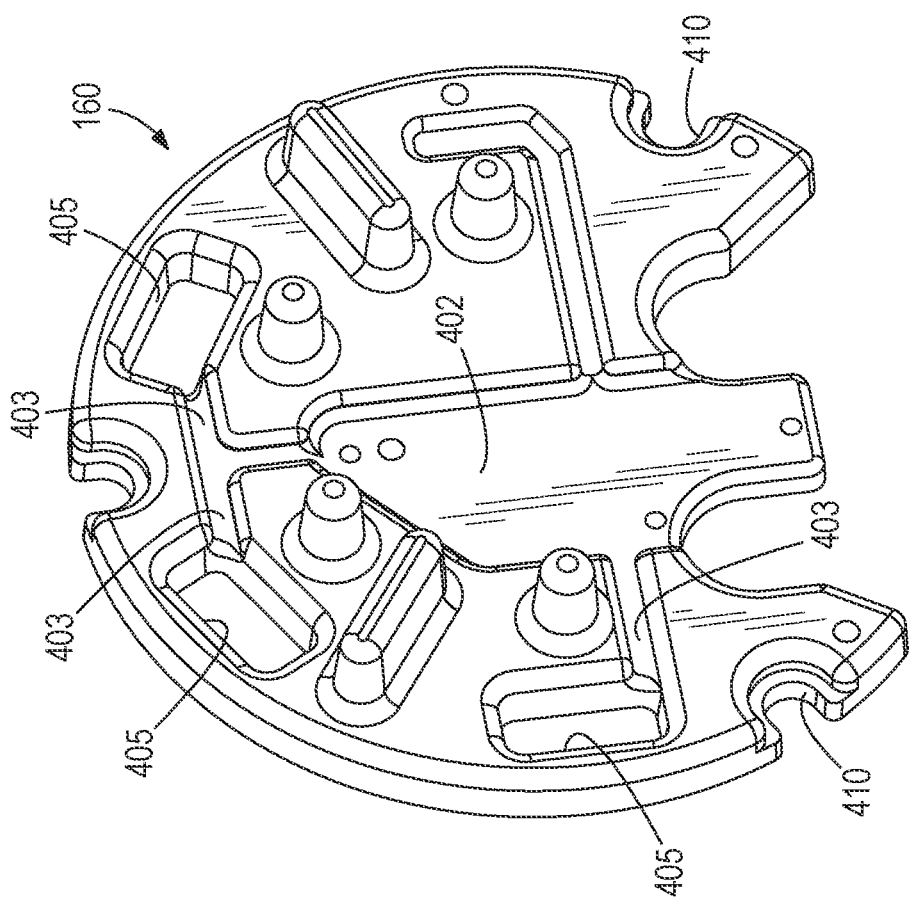
FIG. 26 is a perspective view of a heat sink of the PCB assembly of FIG. 23.

With reference to FIG. 26, the heat sink 160 includes holes 405 aligned with the respective holes 380 in the power PCB through which the terminals 280 pass and connect to the power PCB 165 as mentioned above. Recesses 410 are also provided on the outer circumference of the heat sink 160 through which the fasteners 170 extend. With reference to FIGS. 23 and 24, a low-pressure molding 400 provided with the heat sink 160 supports the end of the position sensor PCB 355 proximate the connection terminals 390 against the heat sink 160, while the position sensor PCB 355 is also fastened to the heat sink 160 (via fasteners 357) to ensure that the position sensor PCB 355 remains in contact with the heat sink 160 and to reduce tolerance stack-up back to the ring magnet 305. In other words, the molding 400 supports the connection terminal 390 on the position sensor PCB 355 and the mating connection terminal 425 on the power PCB 165.

In the illustrated embodiment, the position sensor PCB 355 is received within a recess 402 formed in the heat sink 160, and the low-pressure molding 400 encases the position sensor PCB 355. The low-pressure molding 400 also insulates solder joints for power leads and a ribbon cable connector from contamination. In the illustrated embodiment, the low-pressure molding 400 extends to the holes 405 in the heat sink 160 to provide electrical insulation between terminals 280 and the heat sink 160. In other words, the molding 400 electrically insulates the holes 405 in heat sink 160. Specifically, the heat sink 160 includes a plurality of tracks 403 extending between the recess 402 and the holes 405 to form the molding 400. The molding 400 covers the recess 402, the tracks 403, and the holes 405. The heat sink 160 may also be hard-coat anodized or carbon coated to provide electrical isolation from the terminals 280.

With reference to FIGS. 29-32, a motor assembly 140' according to another embodiment, includes an alternative PCB assembly 155'. The PCB assembly 155' includes features similar to the PCB assembly 155 identified with the same references numerals appended with an ('). The low-pressure molding 400 shown in FIG. 30 does not encase the position sensor PCB 355, but rather encases only an end of the position sensor PCB 355. In addition, the position PCB 355 is mounted to the heat sink 160 without any recess.

Various features of the invention are set forth in the following claims.

What is claimed is:

1. A brushless electric motor comprising:
   a rotor; and
   a stator in which the rotor is received, the stator including
      a core defining a plurality of stator teeth,
      an end cap coupled to the core, the end cap including a plurality of guiding tabs,
      a plurality of coils disposed on the respective stator teeth, and
      a plurality of coil contact plates overmolded within the end cap, each of the coil contact plates includes a first terminal and a second terminal;
      wherein the first terminal and the second terminal each include a hook connected to one of the plurality of coils and wherein the hook protrudes from the guiding tab, wherein the first terminal extends in an axial direction of the motor and wherein the hook is radially outward of the first terminal.

2. The brushless electric motor of claim 1, wherein the end cap includes a plurality of end cap teeth adjacent the respective stator teeth, and wherein the coils are wrapped around the respective stator teeth and the end cap teeth.

3. The brushless electric motor of claim 1, wherein the plurality of coil contact plates contact at least two coils on the stator.

4. The brushless electric motor of claim 1, further comprising a power printed circuit board and a heat sink coupled to the power printed circuit board, wherein the first terminals of the respective coil contact plates extend through the heat sink and are electrically connected to the power printed circuit board.

5. The brushless electric motor of claim 1, wherein the one of the plurality of coils is received between the hook and the first terminal.

6. The brushless electric motor of claim 1, wherein the hook is integrally formed with the first terminal.

7. A brushless electric motor comprising:
   a rotor; and
   a stator in which the rotor is received, the stator including
      a core,
      an end cap coupled to the core,
      a first stator coil coupled to the core,
      a second stator coil coupled to the core,
      a third stator coil coupled to the core, wherein the second stator coil is positioned between the first stator coil and the third stator coil, and
      a first coil contact plate and a second coil contact plate overmolded within the end cap;
      wherein the first coil contact plate short-circuits the first stator coil with the third stator coil, and wherein the second coil contact plate is coupled to the second stator coil, wherein the first coil contact plate includes a terminal extending in an axial direction of the motor, wherein the terminal contacts the first stator coil, wherein the hook is radially outward of the first terminal.

8. The brushless electric motor of claim 7, wherein the stator further includes a fourth stator coil coupled to the core, and wherein the fourth stator coil is positioned between the first stator coil and the second stator coil.

9. The brushless electric motor of claim 8, wherein the stator further includes a third coil contact plate overmolded within the end cap, and wherein the third coil contact plate is coupled to the fourth stator coil.

10. The brushless electric motor of claim 9, wherein the first coil contact plate is radially inward of the second coil contact plate, and wherein the first coil contact plate is radially outward of the third coil contact plate.

11. The brushless electric motor of claim 7, further comprising a hook integrally formed with the terminal, wherein the first stator coil is received between the hook and the terminal.

12. A brushless electric motor comprising:
a rotor; and
a stator in which the rotor is received, the stator including
a core defining a plurality of stator teeth,
an end cap proximate an end of the core,
a plurality of coils disposed on the respective stator teeth, and
a plurality of coil contact plates overmolded within the end cap that short-circuit diagonally opposite coils on the stator,
wherein each of the coil contact plates includes a first terminal and a second terminal diagonally opposite the first terminal,
wherein the first and second terminals include first and second hooks, respectively, and wherein the first and second hooks are connected to a first coil and a second coil, respectively, of the plurality of coils,
wherein the first and second terminal extend in an axial direction of the motor and wherein the first and second hooks are radially outward of the first and second terminal, respectively.

13. The brushless electric motor of claim 12, wherein the coil contact plates are semi-circular in shape.

14. The brushless electric motor of claim 12, further comprising a power printed circuit board and a heat sink coupled to the power printed circuit board; wherein the first terminals of the respective coil contact plates extend through the heat sink and are electrically connected to the power printed circuit board.

15. The brushless electric motor of claim 12, wherein the end cap includes a plurality of guiding tabs, and wherein the first and second terminals protrude from the guiding tabs.

16. The brushless electric motor of claim 12, wherein the end cap includes a plurality of guiding tabs, and wherein the first and second hooks protrude from the guiding tabs.

17. The brushless electric motor of claim 12, wherein the coil contact plates include a first coil contact plate, a second coil contact plate, and a third coil contact plate; wherein the first coil contact plate is radially inward of the second coil contact plate, and wherein the first coil contact plate is radially outward of the third coil contact plate.

18. The brushless electric motor of claim 12, further comprising a plurality of spacers coupled to the coil contact plates; wherein the spacers are positioned between adjacent coil contact plates, thereby creating an insulating gap between the adjacent coil contact plates, before overmolding the coil contact plates within the end cap.

19. The brushless electric motor of claim 18, wherein each of the spacers are molded on one of the coil contact plates.

20. The brushless electric motor of claim 18, wherein the spacers include a first spacer positioned between first and second adjacent coil contact plates, a second spacer between the first coil contact plate and an adjacent third coil contact plate, thereby creating an insulating gap between the adjacent first and third coil contact plates, before overmolding the coil contact plates within one of the first end cap or the second end cap.

21. The brushless electric motor of claim 12, wherein the end cap comprises:
a carrier defining a circumferential groove in which the coil contact plates are positioned; and
an outer resin layer covering at least a portion of each of the coil contact plates and the carrier;
wherein the carrier includes a plurality of ribs positioned in the circumferential groove to separate two adjacent coil contact plates and to provide an air gap therebetween.

22. The brushless electric motor of claim 12, wherein the first and second hooks are integrally formed with the first and second terminals, respectively.

23. The brushless electric motor of claim 12, wherein the first coil is received between the first hook and the first terminal and the second coil is received between the second hook and the second terminal.

* * * * *